(12) United States Patent
Yamaguchi et al.

(10) Patent No.: US 7,652,321 B2
(45) Date of Patent: Jan. 26, 2010

(54) SEMICONDUCTOR DEVICE AND MANUFACTURING METHOD OF THE SAME

(75) Inventors: Tetsuji Yamaguchi, Aichi (JP); Kiyoshi Kato, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 287 days.

(21) Appl. No.: 11/072,632

(22) Filed: Mar. 7, 2005

(65) Prior Publication Data
US 2005/0194645 A1 Sep. 8, 2005

(30) Foreign Application Priority Data
Mar. 8, 2004 (JP) .............................. 2004-063901

(51) Int. Cl.
*H01L 29/72* (2006.01)
(52) U.S. Cl. ...................... 257/316; 257/79; 257/84; 257/347; 257/371; 257/412
(58) Field of Classification Search ............... 257/79, 257/84, 316, 347, 371, 412
See application file for complete search history.

(56) References Cited

U.S. PATENT DOCUMENTS

| | | | |
|---|---|---|---|
| 5,596,214 A | 1/1997 | Endo | |
| 5,818,070 A * | 10/1998 | Yamazaki et al. | 257/72 |
| 5,877,054 A | 3/1999 | Yamauchi | |
| 5,879,990 A | 3/1999 | Dormans et al. | |
| 5,978,270 A | 11/1999 | Tanaka et al. | |
| 6,060,743 A | 5/2000 | Sugiyama et al. | |
| 6,087,679 A | 7/2000 | Yamazaki et al. | |
| 6,133,967 A | 10/2000 | Moon | |
| 6,140,667 A | 10/2000 | Yamazaki et al. | |
| 6,307,214 B1 | 10/2001 | Otani et al. | |
| 6,423,644 B1 | 7/2002 | Nallan et al. | |
| 6,440,870 B1 | 8/2002 | Nallan et al. | |
| 6,472,684 B1 | 10/2002 | Yamazaki et al. | |
| 6,498,369 B1 | 12/2002 | Yamazaki et al. | |
| 6,509,602 B2 | 1/2003 | Yamazaki et al. | |
| 6,541,326 B2 | 4/2003 | Fujiwara | |

(Continued)

FOREIGN PATENT DOCUMENTS

CN 1193414 A 9/1998

(Continued)

OTHER PUBLICATIONS

Office Action (Chinese Application No. 200510065530.5) dated Mar. 28, 2008 with English translation.

*Primary Examiner*—Edward Wojciechowicz
(74) *Attorney, Agent, or Firm*—Nixon Peabody, LLP; Jeffrey L. Costellia

(57) ABSTRACT

In a process of manufacturing elements of different structures and characteristics on the same substrate at the same time, the number of steps is increased and complicated. In view of this, the invention provides a semiconductor device and a manufacturing process thereof in which elements of different structures are formed on the same substrate while reducing the number of steps. According to the invention, in accordance with a memory transistor that requires the largest number of steps when being formed among elements that forms a semiconductor memory device, other high speed transistor and high voltage transistor are efficiently manufactured. Thus, the number of steps is suppressed and a low cost semiconductor memory device can be manufactured.

43 Claims, 19 Drawing Sheets

U.S. PATENT DOCUMENTS

| | | |
|---|---|---|
| 6,579,806 B2 | 6/2003 | Nallan et al. |
| 6,646,288 B2 | 11/2003 | Yamazaki et al. |
| 6,730,957 B1 | 5/2004 | Jang |
| 6,756,640 B2 | 6/2004 | Yamazaki et al. |
| 6,794,712 B1 | 9/2004 | Fujiwara |
| 6,804,149 B2 * | 10/2004 | Ogura et al. ........... 365/185.18 |
| 6,861,685 B2 | 3/2005 | Choi |
| 6,861,707 B1 | 3/2005 | King |
| 6,872,614 B2 | 3/2005 | Fujiwara |
| 7,078,769 B2 | 7/2006 | Yamazaki et al. |
| 2002/0113268 A1 | 8/2002 | Koyama et al. |
| 2003/0052336 A1 * | 3/2003 | Yamazaki et al. ........... 257/200 |
| 2003/0168694 A1 * | 9/2003 | Colclaser et al. ............ 257/326 |
| 2006/0197155 A1 | 9/2006 | Yamazaki et al. |

FOREIGN PATENT DOCUMENTS

| | | |
|---|---|---|
| CN | 1441959 A | 9/2003 |
| EP | 1 220 318 A1 | 7/2002 |
| JP | 11-154714 | 6/1999 |
| JP | 2000-356788 | 12/2000 |
| WO | WO 02/05317 A2 | 1/2002 |
| WO | WO 02/065539 A1 | 8/2002 |

* cited by examiner

| HIGH SPEED TRANSISTOR | HIGH VOLTAGE TRANSISTOR | MEMORY TRANSISTOR |

| HIGH SPEED TRANSISTOR | HIGH VOLTAGE TRANSISTOR | MEMORY TRANSISTOR |

| HIGH SPEED TRANSISTOR | HIGH VOLTAGE TRANSISTOR | MEMORY TRANSISTOR |

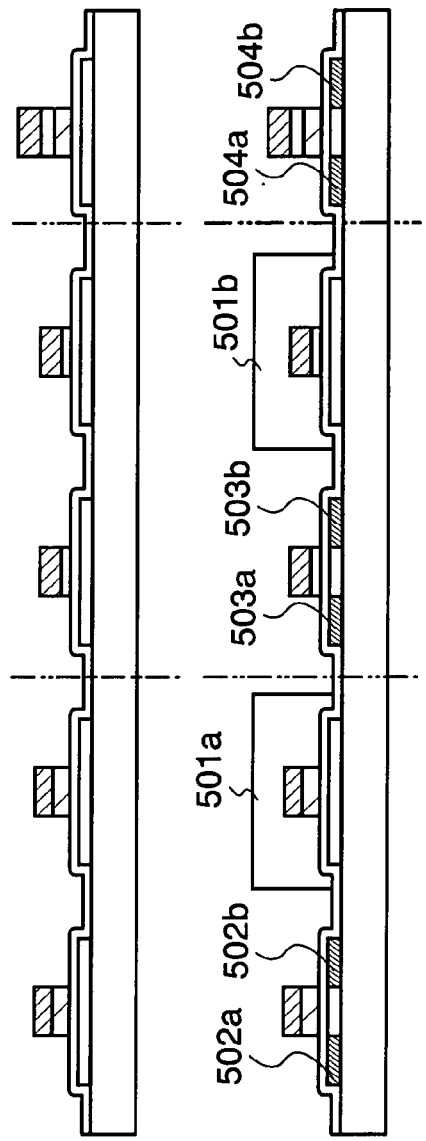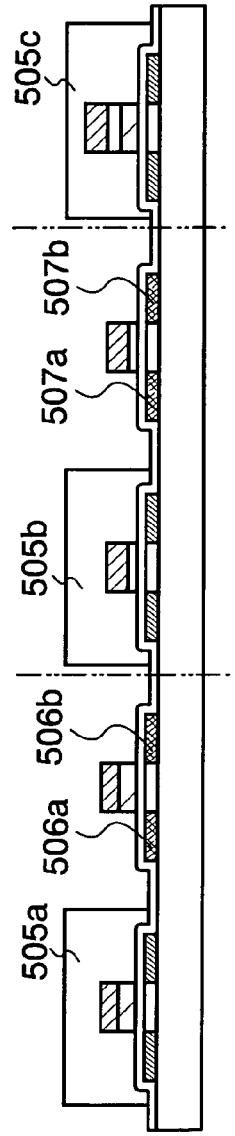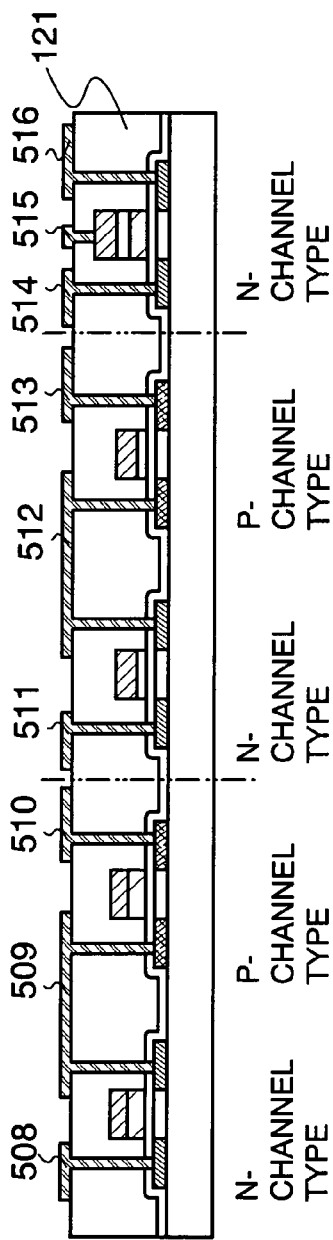

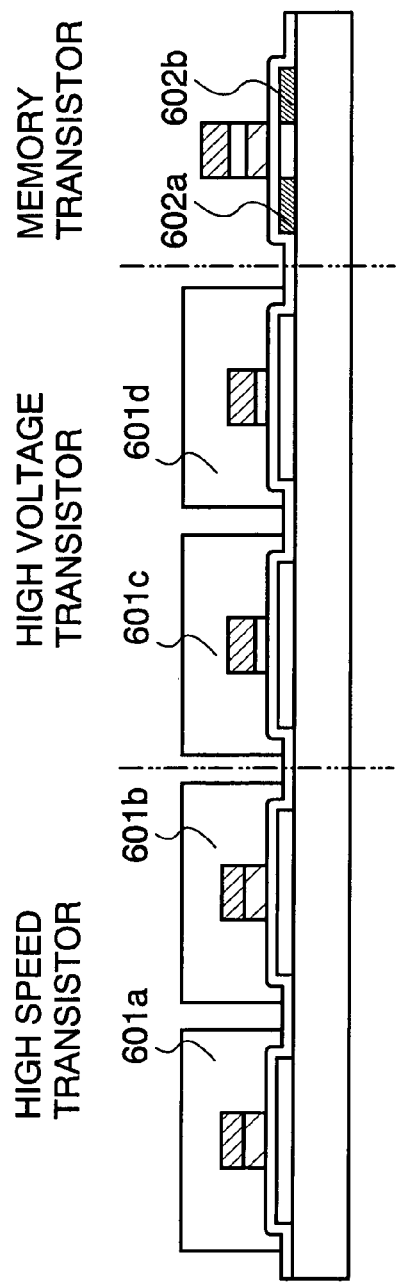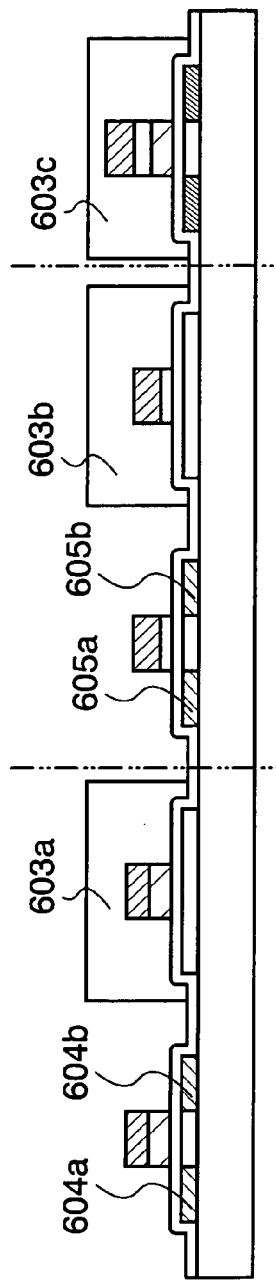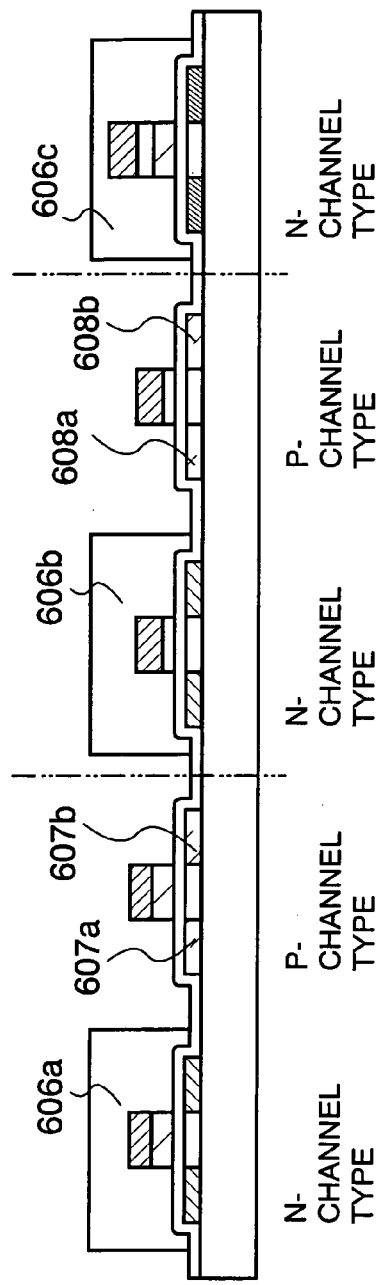

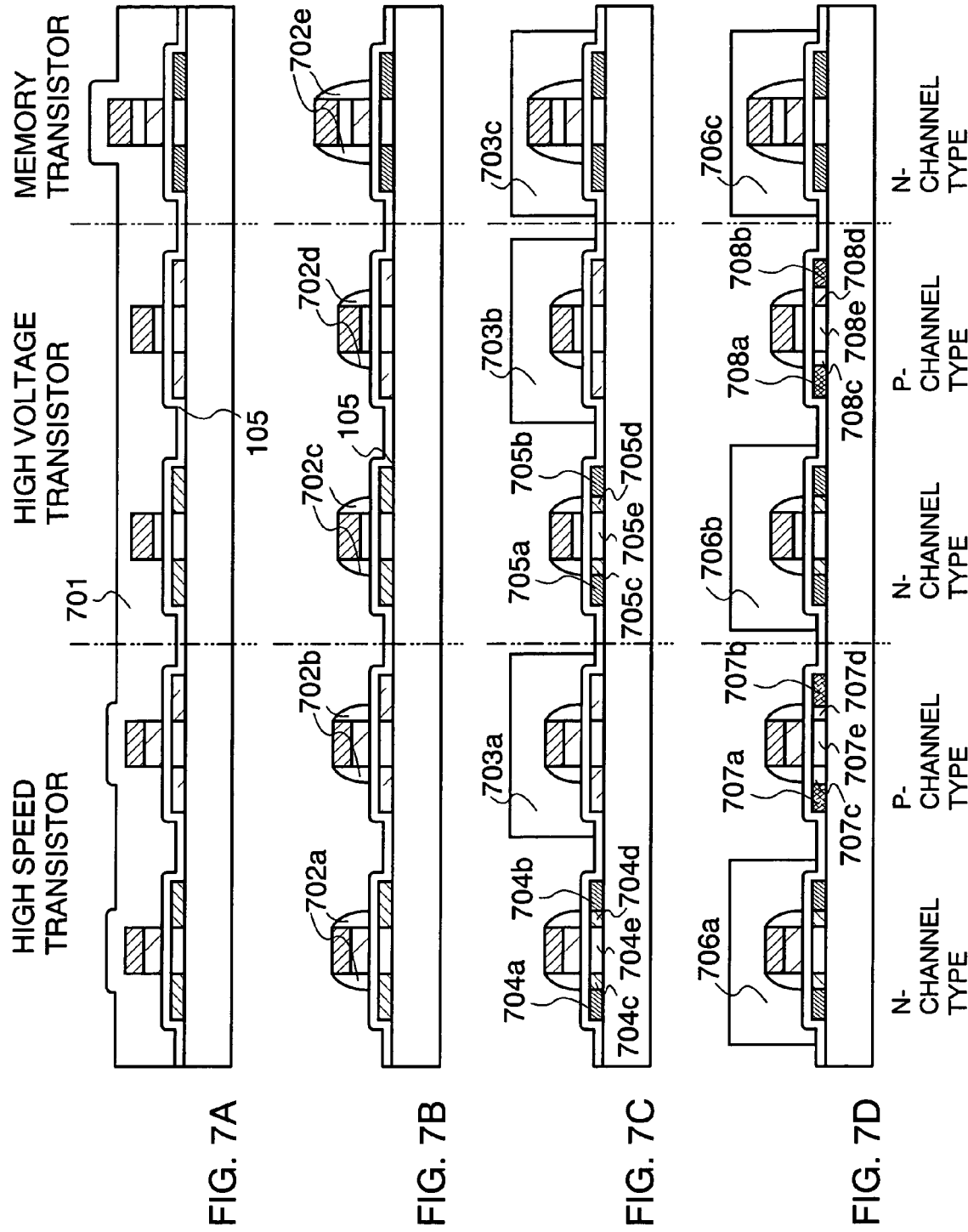

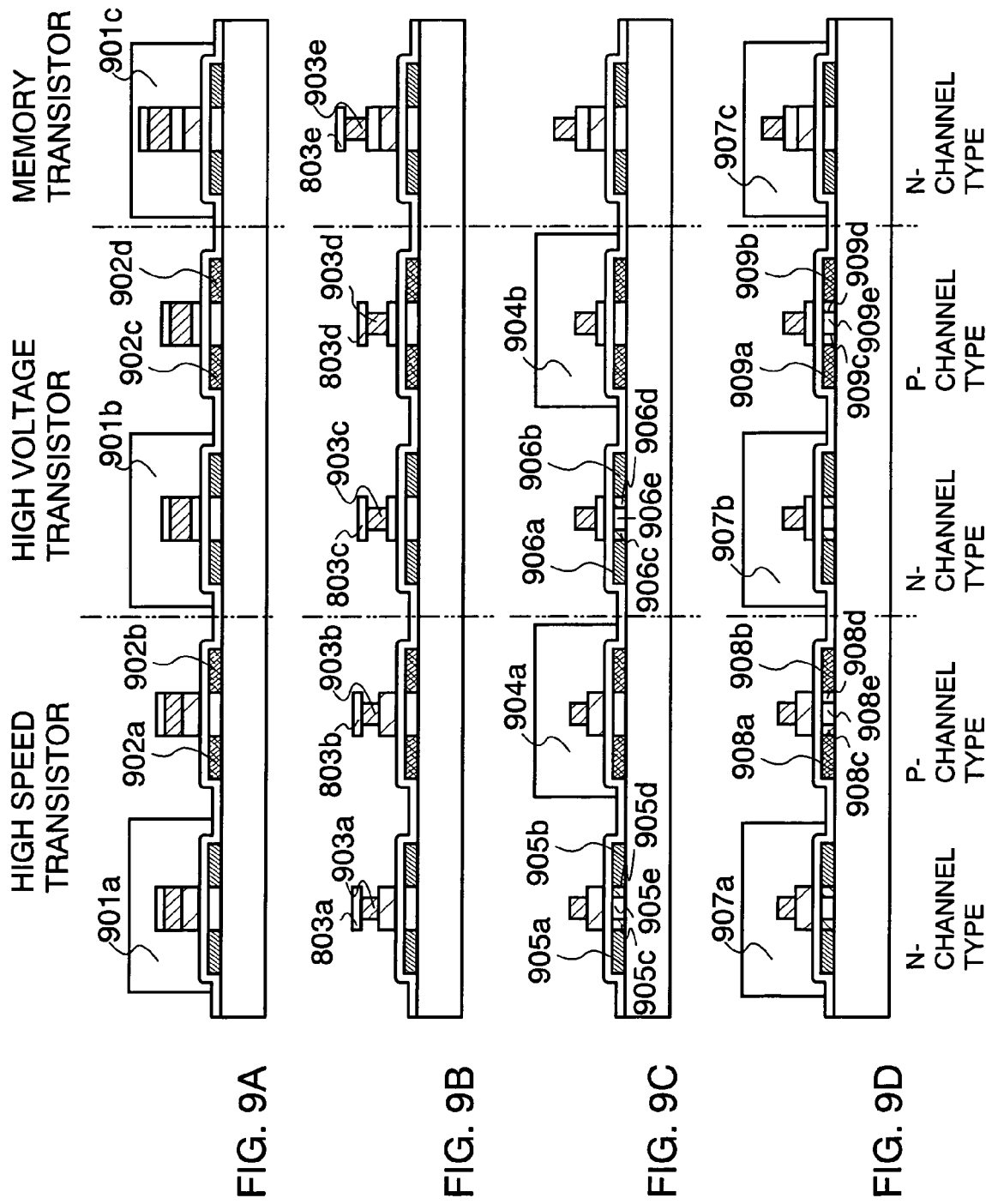

SEMICONDUCTOR DEVICE AND MANUFACTURING METHOD OF THE SAME

BACKGROUND OF THE INVENTION

1. Field of the Invention

The present invention relates to a semiconductor device having a memory transistor on a substrate and a manufacturing method thereof.

2. Description of the Related Art

In recent years, a semiconductor memory device such as a computer having a nonvolatile semiconductor memory element that stores data and program is becoming to be more used. A semiconductor memory device is typically formed of a memory cell array including a plurality of memory transistors in which data is stored (also referred to as memory cell transistors), a circuit for performing writing, erasing, or reading, and a decoder that determines a memory transistor according to an address signal. The elements that form these circuits are required to have different characteristics, therefore, the structures thereof vary accordingly.

An EEPROM (Electric Erasable Programmable Read Only Memory) and a flash memory are known as memories representing a semiconductor nonvolatile memory. When using a memory transistor having a floating gate electrode among these memories, a tunnel oxide film between a semiconductor layer and a floating gate electrode of a memory transistor is required to be as thin as possible. This is because the tunnel oxide film has to be thin enough to allow a tunnel current to flow therethrough. Moreover, a memory transistor is formed of two gate electrodes and two insulating films since a control gate electrode and an insulating film sandwiched by the control gate electrode and the floating gate electrode are included in addition to the floating gate electrode and the tunnel oxide film.

A transistor that forms a decoder is required to operate at a high speed, thus it is preferable that a gate insulating film thereof be thin.

On the other hand, in the circuit for performing writing, erasing, or reading, a voltage as high as a voltage applied to a memory transistor is applied to a transistor that forms the circuit, therefore, a gate insulating film is required to be thick so that the transistor is not broken in such a situation.

As described above, a semiconductor memory device is formed by integrating elements of different structures.

As a related art, there is a technique for forming an active matrix substrate in which a pixel portion, a driver circuit portion, and a memory portion are integrally formed on the same substrate. In this case also, transistors of different structures are integrally formed on an active matrix substrate. Specifically, a gate insulating film of a transistor in the memory portion is formed thinner than a gate insulating film of the pixel portion and the driver circuit portion in order to manufacture a transistor having a structure according to each function (see Patent Document 1).

[Patent Document 1]
Japanese Patent Laid-Open No. 2000-356788

SUMMARY OF THE INVENTION

When manufacturing a semiconductor memory device by integrating the aforementioned transistors of different structures on the same substrate, elements having a thick gate insulating film, a thin gate insulating film, one gate electrode, two electrodes or the like are mixed, thus the number of steps is increased accordingly. Moreover, the number of steps can be decreased by manufacturing each of elements of different structures and connecting them by using wirings, however, the semiconductor memory device is increased in size accordingly.

In view of the aforementioned, the invention provides a semiconductor device in which elements of different structures are formed on the same substrate with less number of steps, and a manufacturing process thereof.

In order to solve the aforementioned problems, the semiconductor device of the invention includes a first transistor having a first active layer, a first gate insulating film over the first active layer, a floating gate electrode on the first gate insulating film, a second gate insulating film on the floating gate electrode, and a control gate electrode on the second gate insulating film, and a second transistor having a second active layer, a gate insulating film over the second active layer, and a gate electrode on the gate insulating film. The first transistor and the second transistor are provided on the same substrate, the gate insulating film of the second transistor includes a bottom gate insulating film and a top gate insulating film, the bottom gate insulating film of the second transistor is formed of the same layer as the first gate insulating film, and the top gate insulating film is formed of the same layer as the second gate insulating film.

Further, the semiconductor device of the invention includes a first transistor having a first active layer, a first gate insulating film over the first active layer, a floating gate electrode over the first gate insulating film, a second gate insulating film on the floating gate electrode, and a control gate electrode on the second gate insulating film, and a second transistor having a second active layer, a gate insulating film over the second active layer, and a gate electrode on the gate insulating film. The first transistor and the second transistor are provided on the same substrate, the gate electrode of the second transistor has a bottom gate electrode and a top gate electrode, the bottom gate electrode of the second transistor is formed of the same layer as the floating gate electrode, and the top gate electrode is formed of the same layer as the control gate electrode.

The semiconductor device of the invention includes a first transistor having a first active layer, a first gate insulating film over the first active layer, a floating gate electrode on the first gate insulating film, a second gate insulating film on the floating gate electrode, and a control gate electrode on the second gate insulating film, a second transistor having a second active layer, a gate insulating film over the second active layer, and a gate electrode on the gate insulating film, and a third transistor having a third active layer, a gate insulating film over the third active layer, and a gate electrode on the gate insulating film. The first to third transistors are provided on the same substrate, the gate insulating film of the third transistor has a bottom gate insulating film and a top gate insulating film, the bottom gate insulating film of the third transistor is formed of the same layer as the gate insulating films of the first and second gate insulating films, the top gate insulating film is formed of the same layer as the second gate insulating film, the gate electrode of the second transistor has a bottom gate electrode and a top gate electrode, the bottom gate electrode of the second transistor is formed of the same layer as the floating gate electrode and the top gate electrode is formed of the same layer as the control gate and the gate electrode of the third transistor.

The gate electrode of the second transistor is lead by using the top gate electrode formed of the same layer as the control gate electrode of the first transistor.

The active layer is formed of a crystalline semiconductor film or a microcrystalline semiconductor film.

According to the semiconductor device of the invention, a first insulating film is formed over the active layer of the first transistor and the active layer of the second transistor, and a first conductive film is formed over the first insulating film. The first conductive film over the active layer of the second transistor is removed by selectively etching the first conductive film to expose the first insulating film over the active layer of the second transistor. A second insulating film is formed over the etched first conductive film and the exposed first insulating film, and a second conductive film is formed over the second insulating film and etched to form a gate electrode of the second transistor and a control gate electrode of the first transistor. After etching the second conductive film, the second insulating film is etched, after which the etched first conductive film is etched to form a floating gate electrode of the second transistor. The gate insulating film of the second transistor is formed of the first insulating film and the second insulating film. The first transistor and the second transistor are provided on the same substrate.

According to the semiconductor device of the invention, a first insulating film is formed over the active layer of the first transistor and the active layer of the second transistor, a first conductive film is formed over the first insulating film. A second insulating film is formed over the first conductive film and the second insulating film is selectively etched to remove the second insulating film over the active layer of the second transistor to expose the first conductive film over the active layer of the second transistor. A second conductive film is formed over the etched second insulating film and the exposed first conductive film. The second conductive film is etched to form the top gate electrode of the second transistor and the control gate of the first transistor. The first conductive film is etched to form the bottom gate electrode of the second transistor and the floating gate of the first transistor. The first transistor and the second transistor are formed on the same substrate.

According to the semiconductor device of the invention, a first insulating film is formed over the active layer of the first transistor, an active layer of the second transistor, and the active layer of the third transistor. A first conductive film is formed over the first insulating film, first etching is selectively applied to the first conductive film to remove the first conductive film over the active layer of the third transistor to expose the first insulating film over the active layer of the third transistor. A second insulating film is formed over the first conductive film that is applied the first etching and the exposed first insulating film. Second etching is selectively applied to the second insulating film to remove the second insulating film over the active layer of the second transistor to expose the first conductive film over the second transistor. A second conductive film is formed over the second insulating film that is applied the second etching and the exposed first conductive film. Third etching is applied to the second conductive film to form a control gate electrode of the first transistor, a top gate electrode of the second transistor, and a gate electrode of the third transistor. Fourth etching is applied to the second insulating film that is applied the second etching. Fifth etching is applied to the first conductive film that is applied the first etching to form a floating gate electrode of the first transistor and a bottom gate electrode of the second transistor. A gate insulating film of the third transistor is formed of the first insulating film and the second insulating film. The first transistor, the second transistor, and the third transistor are provided on the same substrate.

By the first etching, a pattern of the first conductive film covering the active layer of the first transistor and a pattern of the first conductive film covering the active layer of the second transistor are formed.

The floating gate electrode is formed of a tantalum nitride film or a tantalum film and the control gate electrode is formed of a tungsten film.

In this specification, a memory element having a floating gate electrode is referred to as a memory transistor, a transistor having a gate insulating film formed of two layers is referred to as a high voltage transistor, and a transistor having a gate insulating film as thick as the first gate insulating film of the memory transistor (a gate insulating film sandwiched between the floating gate electrode and the active layer) is referred to as a high speed transistor. The memory transistor can write or read data, and can erase the written data in some cases. The high voltage transistor is a applied a voltage as high as a voltage applied to the memory transistor and has a gate insulating film thick enough not to be broken when a high voltage is applied. The high speed transistor operates at a high speed and forms a peripheral circuit such as a decoder.

In this specification, a semiconductor memory device includes at least a memory transistor. Further, in this specification, a semiconductor device includes at least a semiconductor memory device.

According to the invention, by manufacturing a high speed transistor and a high voltage transistor efficiently corresponding to a memory transistor that requires the most steps to be formed among the transistors that form the semiconductor device, the number of steps can be suppressed and a low cost semiconductor device can be formed on the same substrate. Moreover, the following effect can also be brought out.

By stacking first and second insulating films corresponding to the first and the second gate insulating films of the memory transistor respectively, a thick gate insulating film of a high voltage transistor is formed. Accordingly, the gate insulating film of the high voltage transistor can be formed without increasing the number of steps. Further, the gate insulating film of the high voltage transistor can be formed by stacking layers of different materials, therefore, a transistor having desired capacitance and high voltage resistivity is formed.

By stacking the first and the second conductive films in which the floating gate electrode and the control gate electrode of the memory transistor are formed, a gate electrode of the high speed transistor is formed. Accordingly, the gate electrode of the high speed transistor can be formed without increasing the number of steps. Further, since the gate electrode of the high speed transistor can be processed into various shapes, a lightly doped drain (LDD) structure can be employed that a low concentration impurity region is provided externally a channel region having. This low concentration impurity region is referred to as an LDD region. In particular, a structure that the LDD region is overlapped with a gate electrode through the gate insulating film (GOLD (Gate-drain Overlapped LDD) structure) can be formed. With such a structure, voltage resistivity and reliability of the transistor can be improved.

The gate electrode of the high speed transistor having a two-layer structure can be formed by combining a gate electrode material having an optimal work function and a low resistant gate electrode material for leading. Therefore, a low resistant high speed transistor having a desired threshold value can be obtained as well as the range of the material used for the gate electrode is expanded.

According to the invention, when etching a conductive film and an insulating film after depositing the second conductive film, the etching can be performed by using the one same resist mask for each transistor. That is, a resist mask is not required to be formed additionally every time etching is performed, therefore, the resist mask is required to be formed only once, thus the number of steps can be reduced. Specifically, when performing etching for forming the control gate electrode and the floating gate electrode of the memory transistor, and etching of the second insulating film, only one resist mask is required. When performing etching for forming a gate electrode and etching of the second insulating film of the high voltage transistor, only one resist mask is required. When performing etching for forming the top and the bottom gate electrodes of the high speed transistor, only one resist mask is required.

By etching the first conductive film, the first insulating film over the active layer of the high voltage transistor is exposed and a pattern of the first conductive film (a film to be a bottom gate electrode and a film to be a floating gate electrode) is formed over the active layer of the high speed transistor and the active layer of the memory transistor respectively. At that time, the film to be the bottom gate electrode and the film to be the floating gate electrode are formed one size larger than the active layer of the high speed transistor and the active layer of the memory transistor, therefore, a thin gate insulating film formed of the first insulating film can be protected from plasma damage generated in subsequent steps.

BRIEF DESCRIPTION OF THE DRAWINGS

FIGS. 5A to 5D are diagrams showing manufacturing steps of the semiconductor memory device of the invention.

FIGS. 6A to 6C are diagrams showing manufacturing steps of the semiconductor memory device of the invention.

FIGS. 7A to 7D are diagrams showing manufacturing steps of the semiconductor memory device of the invention.

FIGS. 9A to 9D are diagrams showing manufacturing steps of the semiconductor memory device of the invention.

DETAILED DESCRIPTION OF THE INVENTION

Figure 1A:
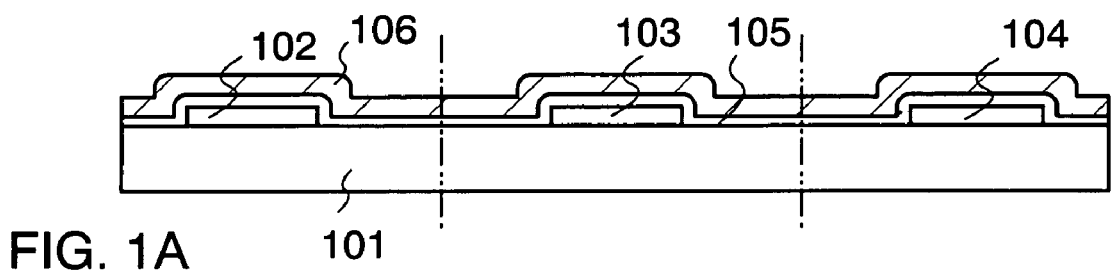
FIGS. 1A to 1E are diagrams showing manufacturing steps of the semiconductor memory device of the invention.

Although the invention will be fully described by way of example with reference to the accompanying drawings, it is to be understood that various changes and modifications will be apparent to those skilled in the art. Therefore, unless such changes and modifications depart from the scope of the invention, they should be construed as being included therein. Note that identical portions in the drawings are denoted by the same reference numerals and detailed descriptions thereof are omitted.

Embodiment Mode 1

FIGS. 1A to 1E, 2A to 2E, and 3A and 3B are diagrams showing manufacturing steps of the semiconductor memory device according to the invention.

For a substrate 101 in FIG. 1A, a quartz substrate, a ceramics substrate, a plastic substrate, a stainless substrate, a synthetic resin substrate, a flexible substrate and the like can be used. When using these substrates, a base film (not shown) in contact with the substrate is provided as required. In this specification, a substrate on which a base film is disposed is also referred to as a substrate.

A semiconductor film is formed in contact with the substrate 101. It is preferable that the semiconductor film be formed of crystalline semiconductor that is obtained by crystallizing an amorphous semiconductor film by laser crystallization, which is formed by a deposition method such as a low pressure CVD method, a plasma CVD method, or a sputtering method. Further, a crystalline semiconductor film obtained by crystallizing by a solid-phase growth method an amorphous semiconductor film formed by the deposition method, or a crystalline semiconductor film obtained by crystallizing by laser irradiation after thermal treatment may be used as well. Moreover, a crystalline semiconductor film obtained by laser-crystallizing a microcrystalline semiconductor film formed of silane ($SiH_4$) as a source material may be used. A microcrystalline semiconductor film may be used also. A semiconductor material used here is silicon (Si), germanium (Ge), silicon germanium alloy, silicon carbide as well as a compound semiconductor material such as gallium arsenic. In this embodiment mode, a crystalline silicon film is deposited as a semiconductor film. Moreover, a semiconductor film may be formed by using an SOI (Silicon On Insulator) substrate.

After that, channel doping is performed for controlling a threshold value, with an acceleration voltage of 25 kV and a material gas of $B_2H_6$ in this embodiment mode.

Next, a semiconductor film is patterned to form active layers 102 to 104. The active layer 102 is a semiconductor layer that forms the high speed transistor, the active layer 103 is a semiconductor layer that forms the high voltage transistor, and the active layer 104 is a semiconductor layer that forms the memory transistor. A silicon oxide film is formed as a first insulating film 105 over these active layers. Using the silicon oxide film as a gate insulating film, there is an advantage that a surface state between the gate insulating film and a silicon film of the active layer is reduced. As the first insulating film 105 functions as a gate insulating film in the high speed transistor and first gate insulating film as a tunnel oxide film in the memory transistor, higher speed operation is achieved with thicker film and the tunnel current flows easily. Therefore, any methods may be used as long as the first insulating film 105 is formed thin, however, a thermal oxide film that can be formed uniformly thin is appropriate for a heat resistant substrate such as a quartz substrate. The first insulating film 105 has a thickness of 1 to 100 nm and more preferably 1 to 10 nm.

Figure 1B:
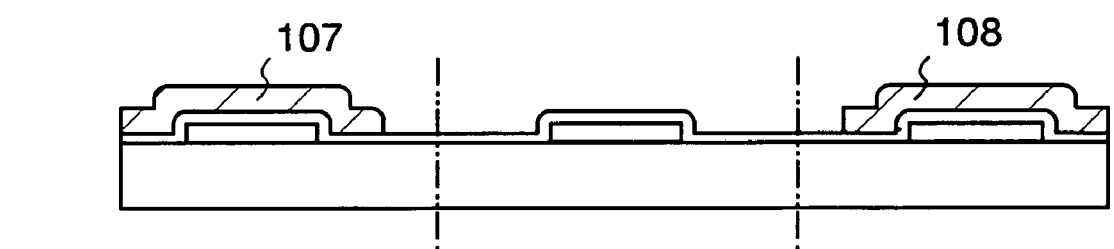

Subsequently, a first conductive film 106 is formed over the first insulating film 105 (FIG. 1A). For the first conductive film 106, a conductive film can be used, for example, a metal film or a semiconductor film doped with impurities can be employed. When using a semiconductor film, a crystalline semiconductor film or a microcrystalline semiconductor film can be used. The semiconductor material and a deposition method thereof are similar to the aforementioned semiconductor films from which the active layers 102 to 104 are formed. In this embodiment mode, a tantalum nitride (TaN) film or a tantalum (Ta) film is used for the first conductive film 106. After that, the first conductive film 106 is etched to form a film 107 to be the bottom gate electrode of the high speed transistor and a film 108 to be the floating gate electrode later. At the same time, the first conductive film over the active layer 103 of the high voltage transistor is removed and the first insulating film under that is exposed (FIG. 1B).

For the first conductive film 106, it is preferable to use a material having sufficiently high etch selectivity relative to the first insulating film 105. For example, when using a tantalum nitride film or a tantalum film for the first conductive film 106 and a silicon oxide film for the first insulating film 105, by using $Cl_2$ for an etching gas, the etch selectivity of the first conductive film 106 relative to the first insulating film can be ten or more, thus over etching of the first insulating film 105 that is exposed can be prevented.

In addition, by forming the first conductive film 106 thin, etching time for the first conductive film can be reduced, thus over etching of the first insulating film 105 over the active layer 103 can be suppressed. When the first conductive film is thin, coverage of a second insulating film to be deposited subsequently is improved and effect of steps of a base film can be reduced when etching the control gate electrode formed on the second insulating film. In view of the aforementioned, it is preferable to form the first conductive film 106 in thickness of 5 to 100 nm or preferably 5 to 20 nm.

Figure 1C:
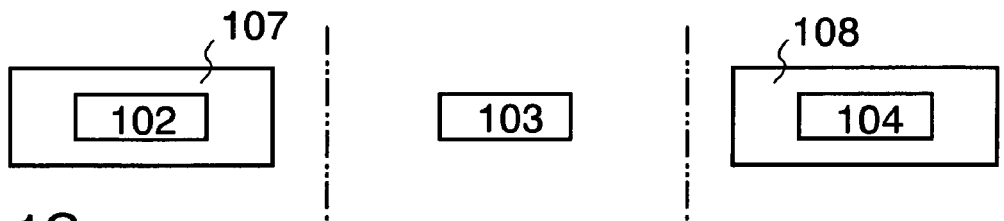

FIG. 1C is a top plan view showing a positional relationship of the active layers 102 to 104, the film 107 thereover to be the bottom gate electrode, and the film 108 to be the floating gate electrode. The film 107 to be the bottom gate electrode is etched one size larger in longitudinal and lateral directions than the active layer 102. Accordingly, the active layer 102 of the high speed transistor and the first insulating film portion of the high speed transistor (a gate insulating film of the high speed transistor) are covered with the film 107 to be the bottom gate electrode. This is for preventing the first insulating film portion of the high speed transistor (a portion that functions as a gate insulating film of the high speed transistor) from plasma damage in a plasma process performed later. Further, the gate insulating film of the high speed transistor is quite thin and easily generates a defect with even a small damage, therefore it is quite effective to prevent the plasma damage.

The film 108 to be the floating gate electrode is etched one size larger in longitudinal and lateral directions than the active layer 104, similarly to the film 107 to be the bottom gate electrode. Accordingly, the active layer 104 of the memory transistor and the first insulating film portion of the memory transistor (a portion that functions as the first gate insulating film of the memory transistor) are covered with the film 108 to be the floating gate electrode. Accordingly, the first insulating film 105 can be prevented from plasma damage, thus a defect that is generated in the first gate insulating film can be suppressed. With even one defect in the first gate insulating film, charges accumulated in the floating gate electrode leak from the defect, thus a charge holding characteristic of the memory transistor is considerably affected, however, this does not apply to the invention.

Moreover, the length of the channel width direction of the film 108 (a longitudinal direction in FIG. 1C) is maintained as long even after etching for forming the floating gate electrode, which is performed later. Therefore, as the floating gate electrode can occupy a large area, it is effective to form the channel width direction of the film 108 long for optimizing a charge injection/erasing efficiency when the memory transistor operates.

Figure 1D:
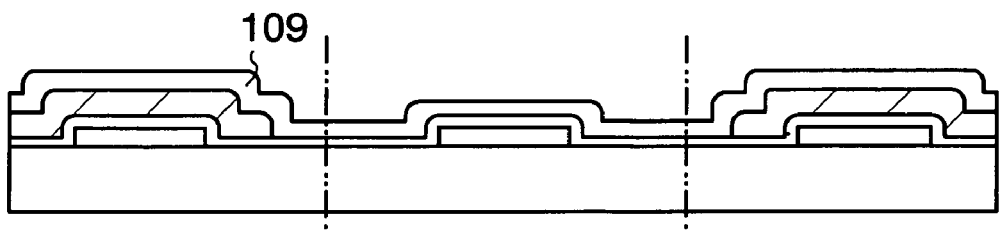
Figure 1E:
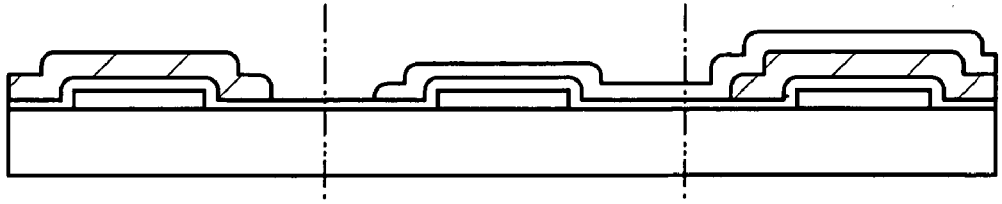

Subsequently, a second insulating film 109 is formed over the film 107 to be the bottom gate electrode, the film 108 to be the floating gate electrode, and the exposed first insulating film (the bottom gate insulating film) (FIG. 1D). After that, the second insulating film over the film 107 is removed by etching, that is not required for the high speed transistor only to expose the film 107 (FIG. 1E). For the second insulating film, a silicon oxide film is used in this embodiment, although the same material as the first insulating film does not have to be used. By performing plasma etching using $CHF_3$ gas for etching this second insulating film, the selectivity of tantalum nitride or tantalum of the first conductive film relative to the silicon oxide film of the second conductive film can be ten or more. By wet etching using hydrofluoric acid also, the selectivity relative to tantalum nitride or tantalum can be sufficiently large. Here, a gate insulating film of the high speed transistor is covered with the film 107 to be the bottom gate electrode, therefore, it is not affected by plasma damage when removing the second insulating film.

In this embodiment mode, a silicon oxide film is used for the second insulating film as is for the first insulating film, although a silicon nitride film or a film containing a silicon nitride film ($SiO_2/SiN/SiO_2$) each having a larger dielectric constant than the silicon oxide film may be used as well. Accordingly, a high voltage transistor having a gate insulating film having desired capacitance and thickness can be manufactured when forming a silicon nitride film having a larger dielectric constant than the silicon oxide film for the second insulating film.

For example, the first and the second insulating films are formed of silicon oxide films and the silicon oxide film as the gate insulating film of the high voltage transistor is formed thick. Then, although a transistor is designed to have desired capacitance in general, when a dielectric constant e and an electrode area S are constant, capacitance C becomes small in the following formula $C=e \times S/d$ (C: capacitance, e: dielectric constant, S: electrode area, and d: film thickness). In the case where the second conductive film that is stacked has a dielectric constant e larger than that of the silicon oxide film of the first conductive film, the film thickness can be thick without changing the capacitance of a transistor. Therefore, a high voltage transistor having desired capacitance and a gate insulating film of a desired thickness can be manufactured. That is, by forming a gate insulating film of a stacked-layer structure, a transistor having desired capacitance and high voltage resistivity can be provided.

Figure 2A:
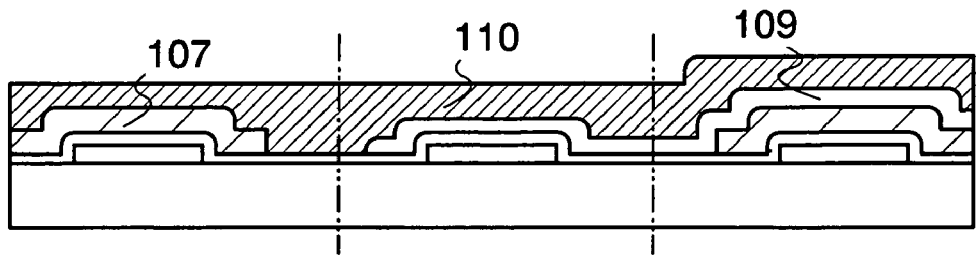
FIGS. 2A to 2E are diagrams showing manufacturing steps of the semiconductor memory device of the invention.

After that, as shown in FIG. 2A, a second conductive film 110 is formed over the film 107 to be the bottom gate electrode and the second insulating film 109. The second conductive film 110 may be any conductive film similarly to the first conductive film. In this embodiment mode, a tungsten (W) film is used.

Figure 2B:
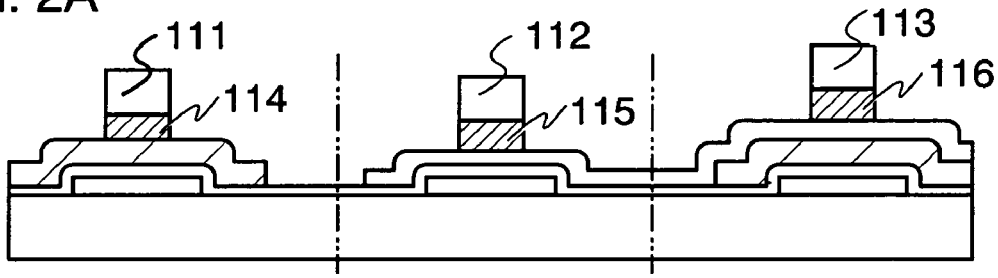

A resist is formed on the second conductive film 110 to form resist masks 111 to 113. The second conductive film 110 is etched by using the resist masks 111 to 113, thereby a top gate electrode 114 of the high speed transistor, a gate electrode 115 of the high voltage transistor, and a control gate electrode 116 of the memory transistor are formed. A tungsten film can be etched by using a mixed gas of $CF_4$, $Cl_2$, and $O_2$, or $SF_6$, $Cl_2$, and $O_2$. The selectivity of the first conductive film relative to a tantalum nitride film or a tantalum film can be five or more (FIG. 2B).

At this time, wirings are lead by using the second conductive film 110. Here, provided that wirings are lead by using the first conductive film, the first conductive film has to be formed thin as described above, therefore, wiring resistance cannot be decreased. Therefore, it is preferable to lead wirings by using the second conductive film that is not particularly limited in thickness. In particular, tungsten as a material of the second conductive film is optimal for leading wirings as resistance thereof is lower by about one tenth as compared to tantalum nitride or tantalum as a material of the first conductive film.

The first and the second conductive films may be formed of the same material, although a following effect is generated when forming them of different materials. In general, by forming a gate electrode by using a gate electrode material having an optimal work function, a threshold value of the transistor is controlled. However, some gate electrode materials having optimal work functions but high resistance, which are not suitable for leading wirings are unlikely to be used as a gate electrode material.

Figure 2C:
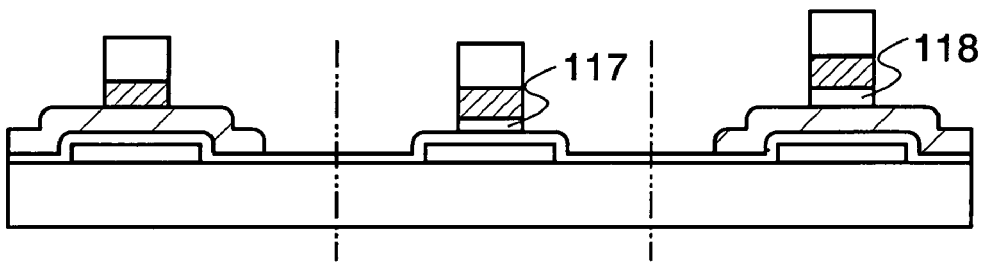

Subsequently, the second insulating film is etched by using the resist masks 112 and 113 (FIG. 2C). At this time, by performing dry etching using $CHF_3$, etching rate of a silicon oxide film as the second insulating film can be ten times as large as tantalum nitride or tantalum of the film 108 to be the floating gate electrode. By performing wet etching using hydrofluoric acid also, similar etching rate can be obtained. Accordingly, since the film 107 to be the bottom gate electrode and the film 108 to be the floating gate electrode have almost no difference in thickness, etching of the film 107 and the film 108 as a next step can be finished in the same time. Thus, over etching of the first insulating film can be prevented. By this etching, patterns 117 and 118 formed of the second insulating film are formed. The pattern 117 functions as the top gate insulating film of the high voltage transistor and the pattern 118 functions as the second gate insulating film of the memory transistor. A silicon oxide film as the second insulating film is a floating gate electrode material having sufficient etching selectivity relative to tantalum nitride or tantalum. Therefore, the first insulating film that is left after etching can be formed into the same thickness for the high speed transistor and the memory transistor without etching the film 108 to be the floating gate electrode and the first insulating film 105 under that unnecessarily.

Figure 2D:
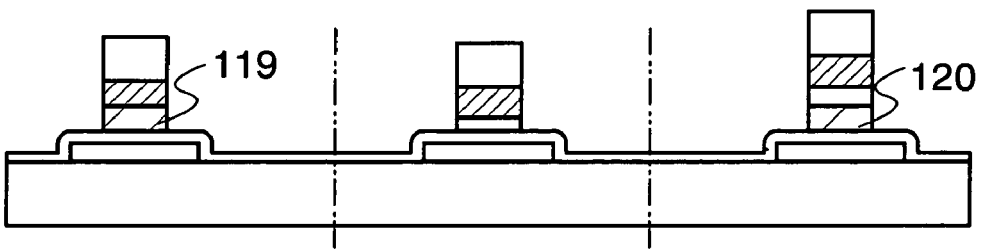

Subsequently, the film 107 to be the bottom gate electrode and the film 108 to be the floating gate electrode are etched by using resist masks 111 and 113, thereby a bottom gate electrode 119 and a floating gate electrode 120 of the high speed transistor are formed (FIG. 2D). These films 107 and 108 formed of tantalum nitride or tantalum are etched by using $Cl_2$ as an etching gas, thus selectivity relative to the silicon oxide film of the first insulating film can be ten or more. Accordingly, even when the film 107 to be the bottom gate electrode and the film 108 to be the floating gate electrode have a difference in thickness and one of the first insulating films thereof is over-etched, it is not going to be a substantial problem since there is an absolute amount thereof is not large.

Figure 2E:
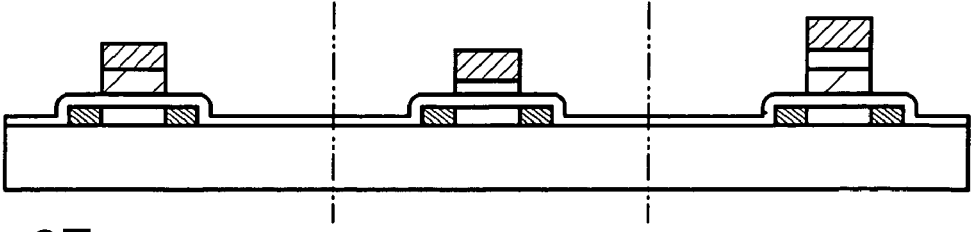

After removing the resist masks 111 to 113, impurity elements are doped to the active layers 102 to 104, thereby a source region and a drain region are formed in each active layer (FIG. 2E). The first gate insulating film of the high voltage transistor may be etched to some extent when etching the first conductive film in FIG. 1B, however, the thickness thereof is almost the same as the thickness of the first gate insulating film of the memory transistor. Therefore, doping can be performed to all the transistors at the same time through the first insulating film of the same thickness, thus different transistors can be manufactured while suppressing the number of doping steps.

As described above, after the completion of the impurity regions, a cap film formed of a silicon oxide film in thickness of 50 nm is formed so as to cover the top gate electrode 114, the gate electrode 115, and the control gate electrode 116 formed of the second conductive film of each transistor. Then, impurity elements are activated by thermal treatment, laser annealing, lamp annealing and the like. Subsequently, a silicon nitride film containing hydrogen is formed in thickness of 100 nm and applied thermal treatment for hydrogenation. By this hydrogenation, hydrogen emitted from the silicon nitride film terminates such a defect as a dangling bond in the first and the second insulating films and each active layer and reduces an interface state of the film.

Figure 3A:
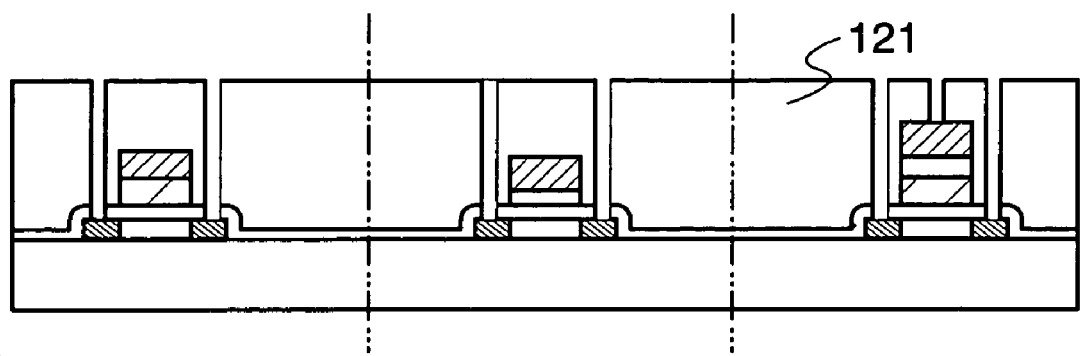
FIGS. 3A and 3B are diagrams showing manufacturing steps of the semiconductor memory device of the invention.

A silicon oxide film is formed over the silicon nitride film, thereby an interlayer insulating film 121 formed of a silicon oxide film, a silicon nitride film, and a silicon oxide film is formed. In FIG. 3A, the interlayer insulating film 121 has a plane surface, however, it does not have to be plane. Moreover, the interlayer insulating film 121 may be formed of a single layer or a stacked-layer of a silicon nitride film, a silicon oxide film, a silicon nitride oxide film, and an organic resin film. In the case of providing a plurality of layers over the interlayer insulating film 121, it is preferable to use a planarizing film of which surface is planarized for the interlayer insulating film 121. After that, contact holes that reaches the active layers 102 to 104 and a contact hole that reaches the control gate electrode 116 are formed in the interlayer insulating film 121 (FIG. 3A).

Figure 3B:
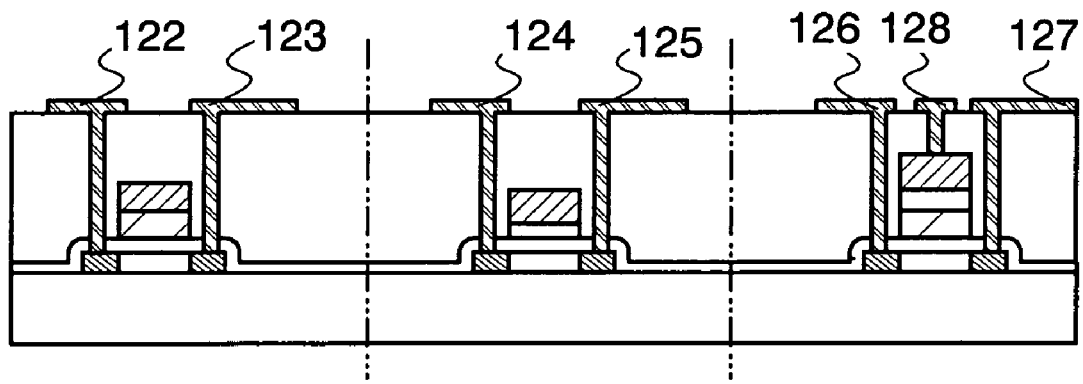

Subsequently, a metal conductive film such as an aluminum film and a copper film is formed and patterned, thereby wirings 122 to 127 connected to the source regions and the drain region of the active layers 102 to 104 and a wiring 128 connected to the control gate electrode 116 are formed (FIG. 3B). By the aforementioned steps, a semiconductor memory device is completed.

By the aforementioned steps, a memory transistor having a floating gate electrode, a high voltage transistor in which gate insulating films are stacked, and a high speed transistor having a gate insulating film as thick as a tunnel oxide film of the memory transistor can be manufactured efficiently on the same substrate by a manufacturing method with a suppressed number of steps.

Note that the gate insulating film of the high voltage transistor manufactured in these steps has approximately the same thickness as a thickness obtained by adding the first insulating film and the second insulating film of the memory transistor. The gate insulating film of the high voltage transistor is only required to be thick enough not to be broken by a voltage applied to the memory transistor. Therefore, it is preferable that the high voltage transistor have a thickness larger than the first gate insulating film of the memory transistor or approximately the same thickness as a thickness obtained by adding the first gate insulating film and the second gate insulating film of the memory transistor.

Moreover, by optimizing the size of the floating gate electrode of the memory transistor, the charge injection/erasing efficiency when the memory transistor operates is optimized.

This manufacturing process has an advantage in that the first gate insulating film and the gate insulating film of the memory transistor and the high speed transistor respectively that requires the highest characteristics can be formed of the same first insulating film, thereby the film quality and thickness can be shared.

In this embodiment mode, a manufacturing process for forming the high speed transistor, the high voltage transistor, and the memory transistor on the substrate at the same time is described, however, the invention is not limited to this. Two transistors may be formed on the same substrate at the same time such as the memory transistor and the high speed transistor, or the memory transistor and a high voltage transistor.

Embodiment Mode 2

FIGS. 4A to 4F show manufacturing steps of a semiconductor memory device according to the invention. In FIGS. 4A to 4F, portions corresponding to FIGS. 1A to 1E, 2A to 2E, and 3A and 3B are denoted by the same reference numerals and detailed descriptions thereof are referred in Embodiment Mode 1.

For a substrate 401 in FIGS. 4A to 4F, a semiconductor substrate formed of single crystalline silicon is used, however, a semiconductor film may be formed by using an SOI (Silicon On Insulator) substrate. Subsequently, channel doping is performed to control a threshold value. In this embodiment mode, an acceleration voltage is 25 kV and a material gas of $B_2H_6$ is used.

Figure 4A:
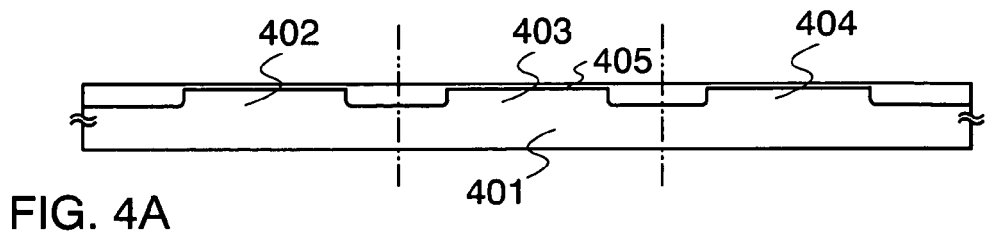
FIGS. 4A to 4F are diagrams showing manufacturing steps of the semiconductor memory device of the invention.

Subsequently, elements are isolated by a known isolation technique such as a LOCOS method (selective oxidizing method) and an STI (Shallow Trench Isolation) method, thereby active layers 402 to 404 are formed over the surface of the semiconductor substrate. The active layer 402 is a semiconductor layer that forms the high speed transistor, the active layer 403 is a semiconductor layer that forms the high voltage transistor, and the active layer 404 is a semiconductor layer that forms the memory transistor. Subsequently, thermal oxidization is performed to form a thermal oxide film in contact with the semiconductor substrate, thereby a first insulating film 405 is formed. A thermal oxide film is optimal for the first insulating film since it can be formed thin evenly (FIG. 4A). However, the first insulating film may be formed by using other deposition methods as well as the thermal oxide film.

Figure 4B:
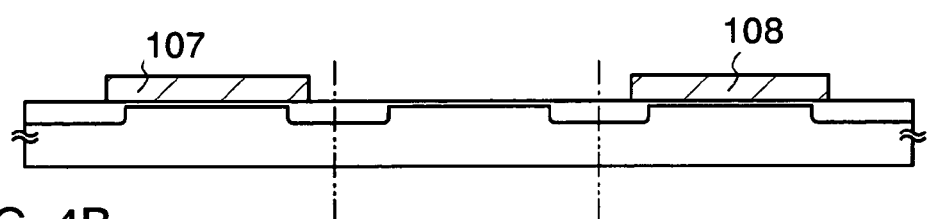
Figure 4C:
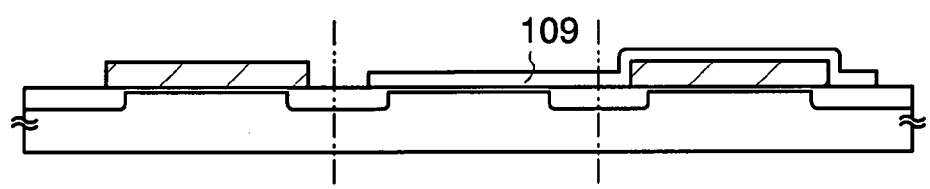

Subsequently, a tantalum nitride (TaN) film or a tantalum (Ta) film is deposited as the first conductive film 106 over the first insulating film. After that, the first conductive film 106 is etched to form the film 107 to be the bottom gate electrode and the film 108 to be the floating gate electrode, thereby the first insulating film over the active layer 403 is exposed (FIG. 4B). Subsequently, a silicon oxide film is formed as the second insulating film 109 over the film 107 to be the bottom gate electrode, the film 108 to be the floating gate electrode, and the exposed first insulating film. After forming the second insulating film 109, only the second insulating film over the film 107 to be the bottom gate electrode is removed by etching (FIG. 4C).

Figure 4D:
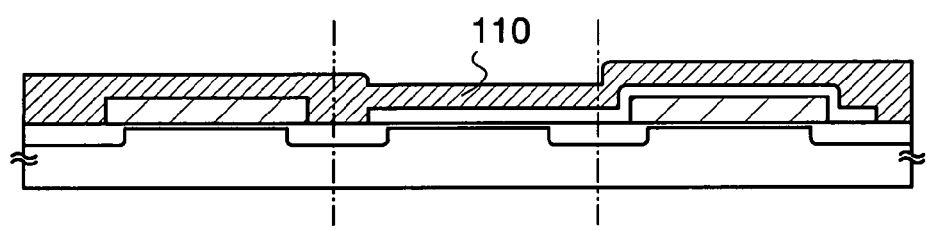

After that, as shown in FIG. 4D, the second conductive film 110 as a tungsten (W) film is formed over the film 107 to be the bottom gate electrode and the second insulating film 109.

Figure 4E:
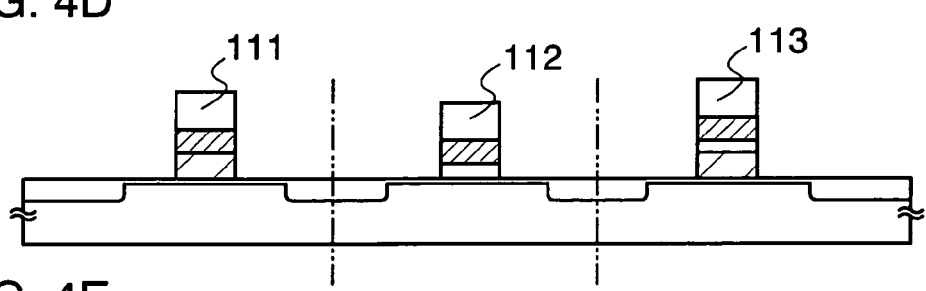

After forming a resist over the second conductive film 110, the resist masks 111 to 113 are formed. The second conductive film 110, the second insulating film 109, the film 107 to be the bottom gate electrode, and the film 108 to be the floating gate electrode are sequentially etched by using the resist masks 111 to 113 to form a gate electrode of each transistor (FIG. 4E).

Figure 4F:
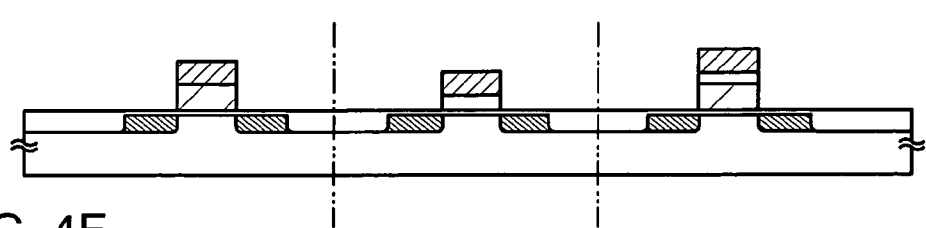

Subsequently, after removing the resist masks 111 to 113, the source regions and the drain regions are formed by doping impurity elements to the active layers (FIG. 4F). After that, the impurity elements are activated by thermal treatment, laser annealing, lamp annealing and the like.

Steps after this are similar to FIGS. 3A and 3B. An interlayer insulating film is formed, a contact hole is formed, and a wiring connected to each semiconductor layer and a control gate electrode is formed for completion.

By the aforementioned steps, a memory transistor having a floating gate electrode, a high voltage transistor in which a gate insulating film is stacked, and a high speed transistor having a gate insulating film as thick as the tunnel oxide film of the memory transistor can be manufactured on the same substrate efficiently by a manufacturing method with a suppressed number of steps.

In this embodiment mode, a manufacturing process for forming the high speed transistor, the high voltage transistor, and the memory transistor on the substrate at the same time is described, however, the invention is not limited to this. Two transistors may be formed on the same substrate at the same time such as the memory transistor and the high speed transistor, or the memory transistor and a high voltage transistor.

Embodiment 1

A manufacturing method of a semiconductor memory device is described in which a memory transistor is formed by an N-channel transistor, a high speed transistor is a P-channel transistor and an N-channel transistor, and a high voltage transistor is formed of a P-channel and an N-channel transistor. Moreover, various examples of the invention are shown with reference to drawings in the following Embodiments 1 to 4. The common portions in the drawings and the aforementioned embodiment modes are denoted by the same reference numerals and detailed descriptions thereof are referred in Embodiment Mode 1.

In this embodiment, similar manufacturing steps to FIGS. 1A to 2D are employed until the step of forming the gate electrode and the like of each element, therefore, steps after FIG. 2D is described with reference to FIGS. 5A to 5D.

FIG. 5A shows a state that the resist mask shown in FIG. 2D is removed from over each gate electrode of the high speed transistor, the high voltage transistor, and the memory transistor. Then, resist masks 501a and 501b are formed. By adding impurity elements imparting N-type conductivity, impurity regions 502a, 502b, 503a, 503b, 504a, and 504b having N-type conductivity are formed. Representatively, an element of the group 15 of Periodic Table, typically phosphorus or arsenic can be used as the N-type impurity element (FIG. 5B).

These impurity regions 502a, 502b, 503a, 503b, 504a, and 504b are a source region and a drain region of the N-channel high speed transistor, a source region and a drain region of the N-channel high voltage transistor, and a source region and a drain region of the N-channel memory transistor respectively. Note that each of the impurity regions formed here contains an N-type impurity element at a concentration of $1\times10^{20}$ to $1\times10^{21}$ atoms/cm$^3$ (typically $2\times10^{20}$ to $5\times10^{21}$ atoms/cm$^3$). In this specification, the impurity region containing N-type impurity elements is defined as an N-type impurity region.

After forming the N-type impurity regions, the resist masks 501a and 501b are peeled off by wet etching, and resist masks 505a to 505c are formed. By adding P-type impurity elements (boron in this embodiment), impurity regions 506a, 506b, 507a, and 507b containing boron at a high concentration are formed (FIG. 5C). In this embodiment, impurity regions containing boron at a concentration of $3 \times 10^{20}$ to $3 \times 10^{21}$ atoms/cm$^3$ (typically $2 \times 10^{20}$ to $5 \times 10^{21}$ atoms/cm$^3$) are formed by ion doping method using diborane ($B_2H_6$). These impurity regions are a source region and a drain region of the P-channel high speed transistor and a source region and a drain region of the P-channel high voltage transistor respectively. In this specification, an impurity region containing P-type impurity elements is defined as a P-type impurity region.

After forming the impurity regions in the active layer of each transistor by the aforementioned steps, the resist masks 505a to 505c are peeled off by wet etching. After that, the impurity regions are activated to form an interlayer insulating film 121. Subsequently, a contact hole is formed by etching the interlayer insulating film 121, thereby N-type impurity regions or P-type impurity regions of each transistor, 502a, 502b, 503a, 503b, 506a, 506b, 507a, and 507b, and wirings 508 to 516 connected to a control gate electrode of the memory transistor are formed (FIG. 5D). For a wiring material, a similar wiring material to the one described in Embodiment Mode 1 is used. By the aforementioned steps, a semiconductor memory device is completed. Note that this embodiment can be applied to the manufacturing method of the semiconductor memory device using the semiconductor substrate shown in FIG. 4.

Embodiment 2

A manufacturing method of a semiconductor memory device of which high voltage transistor and a high speed transistor each has an LDD structure including an LDD region as a low concentration impurity region is described. This embodiment has similar manufacturing steps to FIGS. 1A to 2D until the step of forming the gate electrode of each transistor, therefore, steps after FIG. 2D are described with reference to FIGS. 6A to 6C and 7A to 7D.

After removing the resist masks shown in FIG. 2D from over each gate electrode of the high speed transistor, the high voltage transistor, and the memory transistor, resist masks 601a to 601d are formed. By adding impurity elements imparting N-type conductivity, N-type impurity regions 602a and 602b are formed in the active layers of the memory transistor (FIG. 6A). Representatively, an element of the group 15 of Periodic Table, typically phosphorus or arsenic can be used for the N-type impurity element.

The N-type impurity regions 602a and 602b are a source region and a drain region of the N-channel memory transistor respectively. The N-type impurity region formed here contains N-type impurity elements at a concentration of $1 \times 10^{20}$ to $1 \times 10^{21}$ atoms/cm$^3$ (representatively $2 \times 10^{20}$ to $5 \times 10^{21}$ atoms/cm$^3$).

After forming the N-type impurity regions 602a and 602b, the resist masks 601a to 601d are peeled off by wet etching, thereby resist masks 603a to 603c are formed so as to cover the P-channel high speed transistor, the P-channel high voltage transistor, and the memory transistor. By adding N-type impurity elements, N-type impurity regions 604a, 604b, 605a, and 605b containing N-type impurity elements (phosphorus) at a low concentration are formed (FIG. 6B). Typically, N-type impurity elements are controlled to be added to the N-type impurity regions 604a, 604b, 605a, and 605b at a concentration of $1 \times 10^{16}$ to $5 \times 10^{18}$ atoms/cm$^3$ (typically $3 \times 10^{17}$ to $3 \times 10^{18}$ atoms/cm$^3$).

Subsequently, after peeling the resist masks 603a to 603c off by wet etching, resist masks 606a to 606c are formed and impurity elements imparting P-type conductivity are added to form P-type impurity regions 607a, 607b, 608a, and 608b containing boron at a low concentration (FIG. 6C). Boron (B) is added so that these P-type impurity regions contain the impurity element imparting P-type conductivity at a concentration of $1 \times 10^{16}$ to $5 \times 10^{18}$ atoms/cm$^3$.

The resist masks 606a to 606c are peeled off by wet etching and a silicon oxide film 701 is formed on the whole surface (FIG. 7A). After that, the silicon oxide film 701 is etched back to form sidewalls 702a to 702e on the sides of each gate electrode (FIG. 7B). At this time, the first insulating film 105 is exposed to dry etching altogether with the silicon oxide film 701, however, a portion just beneath each gate electrode that functions as the gate insulating film is not affected by plasma damage since it is protected by the gate electrode.

Subsequently, the P-channel high speed transistor, the high voltage transistor, and the memory transistor are covered with the resist masks 703a to 703c for adding phosphorus at a high concentration. Then, phosphorus is added at a concentration of $1 \times 10^{20}$ to $1 \times 10^{21}$ atoms/cm$^3$ (representatively $2 \times 10^{20}$ to $5 \times 10^{21}$ atoms/Cm$^3$) to form an N-type impurity region containing N-type impurity elements. By adding these impurity elements, a source region 704a and a drain region 704b, LDD regions 704c and 704d as low concentration impurity regions, and a channel forming region 704e of the N-channel high speed transistor are formed. Also, a source region 705a and a drain region 705b, the LDD regions 705c and 705d, and the channel forming region 705e of the N-channel high voltage transistor are formed (FIG. 7C).

Subsequently, the resist masks 703a to 703c are peeled off by wet etching and resist masks 706a to 706c are formed. By adding P-type impurity elements, P-type impurity regions are formed so as to contain boron at a concentration of $3 \times 10^{20}$ to $3 \times 10^{21}$ atoms/cm$^3$. Accordingly, a source region 707a and a drain region 707b, LDD regions 707c and 707d, and the channel forming region 707e of the P-channel high speed transistor are formed. Moreover, a source region 708a and a drain region 708b, LDD regions 708c and 708d, and the channel forming region 708e of the P-channel high voltage transistor are formed (FIG. 7D).

By the aforementioned steps, a high speed transistor and a high voltage transistor other than the memory transistor can have LDD structures. After FIG. 7D, the resist masks 706a to 706c are removed and a step similar to FIG. 5D is performed for completion. According to the structure of this embodiment, voltage resistance of a transistor can be improved by employing the LDD structure and a single channel effect can be suppressed when it is generated as the circuit becomes finer. Note that this embodiment can be applied to the manufacturing method of the semiconductor memory device using the semiconductor substrate shown in FIGS. 4A to 4F.

Embodiment 3

In this embodiment, a manufacturing method of a semiconductor memory device having an LDD structure or a GOLD structure is described, that is different from Embodiment 2. In this embodiment, similar manufacturing steps to FIGS. 1A to 2D are employed until the step of forming the second conductive film, therefore, steps after FIG. 2A are described below with reference to FIGS. 8A to 8C and 9A to 9D. In this specification, an LDD region overlapped with a gate electrode through a gate insulating film is referred to as a Lov region (first LDD region) and the LDD region that is not overlapped with the gate electrode through the gate insulating film is referred to as a Loff region (second LDD region).

Figure 8A:
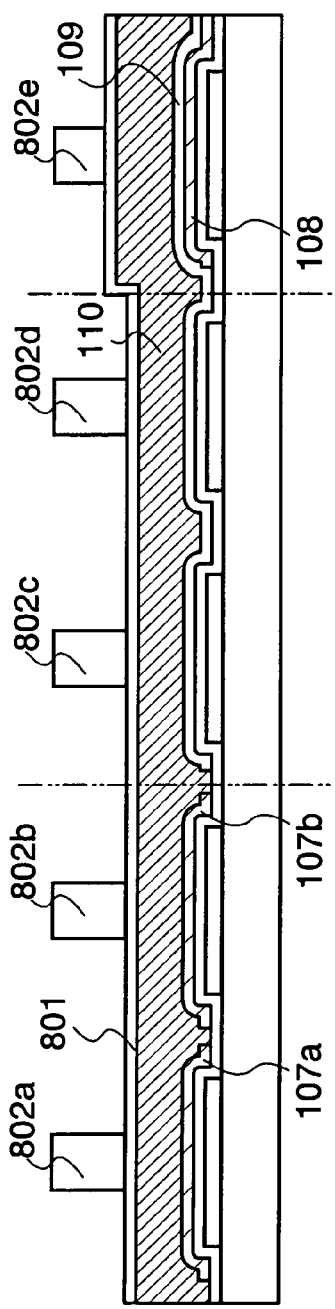
FIGS. 8A to 8C are diagrams showing manufacturing steps of the semiconductor memory device of the invention.

After forming the second conductive film 110, a silicon oxide film 801 is formed over the second conductive film. A resist is accumulated over the silicon oxide film 801 and then patterned to form resist masks 802a to 802e (FIG. 8A). By using these resist masks 802a to 802e, the silicon oxide film 801 beneath is etched to form silicon oxide films 803a to 803e. Subsequently, the second conductive film 110 is etched to form top gate electrodes 804a and 804b, gate electrodes 804c and 804d of the high voltage transistor, and a control gate electrode 804e are formed. Moreover, the second insulating film 109 is etched by using the resist masks 802c to 802e to form top gate insulating films 805a and 805b of the high voltage transistor and a second gate insulating film 805c of the memory transistor are formed. Subsequently, the films 107a and 107b to be the bottom gate electrodes and the film 108 to be the floating gate are etched by using the resist masks 802a, 802b, and 802e to form bottom gate electrodes 806a and 806b, and a floating gate electrode 806c (FIG. 8B).

Figure 8B:
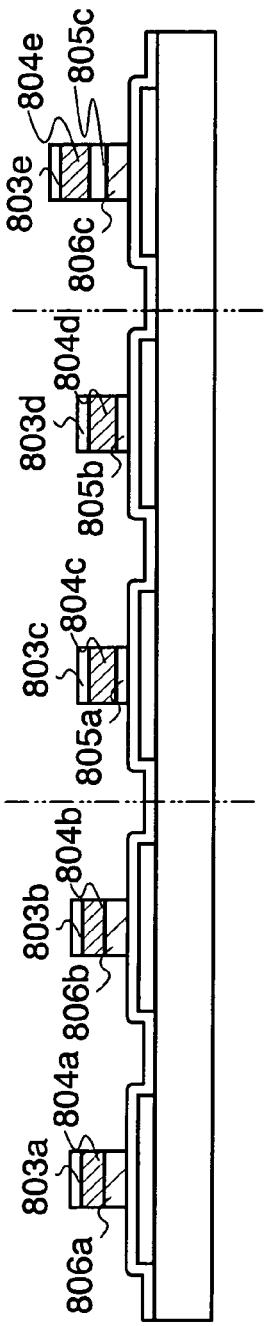

After forming the resist masks 802a to 802e shown in FIG. 8A, each film is etched by using any of the resist masks 802a to 802e until a state of FIG. 8B is obtained.

Figure 8C:
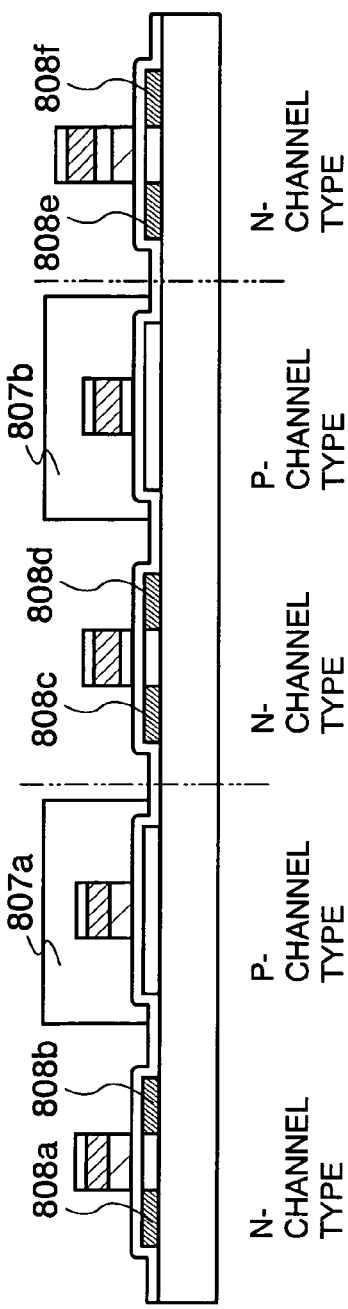

After removing the resist masks 802a to 802e, resist masks 807a to 807b are formed so as to cover the P-channel high speed transistor and the P-channel high voltage transistor. Subsequently, N-type impurity regions 808a to 808f are formed by adding impurity elements imparting N-type conductivity. The N-type impurity regions 808a to 808f are formed by adding impurity elements imparting N-type conductivity. The N-type impurity regions 808a to 808f are formed so that the concentration thereof becomes $1 \times 10^{20}$ to $1 \times 10^{21}$ atoms/cm$^3$ (typically $2 \times 10^{20}$ to $5 \times 10^{21}$ atoms/cm$^3$). For the N-type impurity elements, an element of group 15 of Periodic Table, such as phosphorus or arsenic can be used typically (FIG. 8C).

Subsequently, the resist masks 807a and 807b are peeled off by wet etching and resist masks 901a to 901c are formed. In this state, impurity elements imparting P-type conductivity are added at a high concentration to form P-type impurity regions 902a to 902d. The impurity elements are added so that the P-type impurity regions 902a to 902d contain P-type impurity elements at a concentration of $3 \times 10^{20}$ to $3 \times 10^{21}$ atoms/cm$^3$. For the P-type impurity elements, boron can be used (FIG. 9A).

After that, the resist masks 901a to 901c are peeled off by wet etching. Next, the top gate electrodes 804a and 804b, the gate electrodes 804c and 804d of the high voltage transistor and the control gate electrode 804e are isotropically etched with the silicon oxide films 803a to 803e as masks, thereby the sidewalls thereof are downsized and top gate electrodes 903a and 903b, gate electrodes 903c, 903d of the high voltage transistor, and a control gate electrode 903e are formed (FIG. 9B). Subsequently, silicon oxide films 803a to 803e are removed to form resist masks 904a and 904b that covers the P-channel high speed transistor and the P-channel high voltage transistor. By adding impurity elements imparting N-type conductivity, a source region 905a and a drain region 905b, Lov regions 905c and 905d, and a channel forming region 905e of the N-channel high speed transistor are formed. Also, a source region 906a and a drain region 906b, Loff regions 906c and 906d, and a channel forming region 906e of the N-channel high voltage transistor are formed. The Lov regions 905c and 905d, and the Loff regions 906c and 906d are added N-type impurity elements at a concentration of $1 \times 10^{16}$ to $5 \times 10^{18}$ atoms/cm$^3$ representatively (typically $3 \times 10^{17}$ to $3 \times 10^{18}$ atoms/cm$^3$) (FIG. 9C).

Subsequently, the resist masks 904a and 904b are peeled off by wet etching and resist masks 907a to 907c are formed. Then, P-type impurity regions are formed by adding P-type impurity elements at a low concentration. Boron (B) is added so that the low concentration P-type impurity regions contain impurity elements at a concentration of about $1 \times 10^{16}$ to $5 \times 10^{17}$ atoms/cm$^3$. Accordingly, a source region 908a and a drain region 908b, Lov regions 908c and 908d, and a channel forming region 908e of the P-channel high speed transistor are formed. Also, a source region 909a and a drain region 909b, Loff regions 909c and 909d, and a channel forming region 909e of the P-channel high voltage transistor are formed.

By the aforementioned steps, the high speed transistor has a GOLD structure and the high voltage transistor has an LDD structure. After peeling the resist masks 907a to 907c by wet etching, a similar step as FIG. 5D is applied for completion. By etching the bottom gate electrodes 806a and 806b with the top gate electrodes 903a and 903b as masks so as to have the same gate electrode length as the top gate electrodes, the high speed transistor has an LDD structure having an Loff region.

By employing an LDD structure, a transistor superior in resistivity can be obtained while a transistor superior in reliability can be obtained by employing a GOLD structure, therefore, suitable structure is to be employed according to the application. Note that this embodiment can be applied to the manufacturing method of the semiconductor memory device using the semiconductor substrate shown in FIGS. 4A to 4F.

Embodiment 4

In this embodiment, a manufacturing method of a semiconductor memory device including a high speed transistor and a high voltage transistor having a low concentration impurity region is described. In this embodiment, similar manufacturing steps to FIGS. 1A to 2A are employed until the step of forming the second conductive film, therefore, steps after FIG. 2A are described with reference to FIGS. 10A to 10C and 11A to 11C.

Figure 10A:
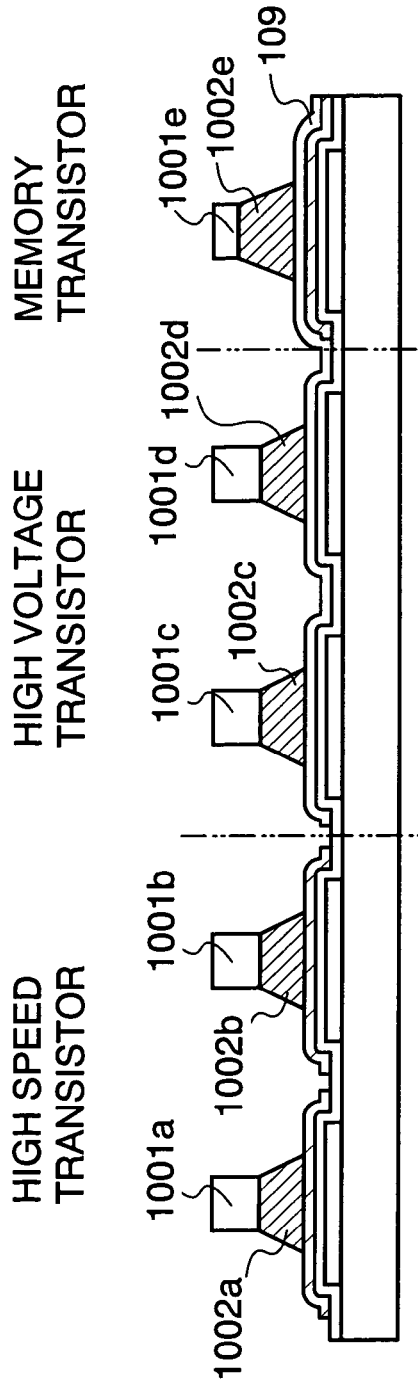
FIGS. 10A to 10C are diagrams showing manufacturing steps of the semiconductor memory device of the invention.

After accumulating a resist over the second conductive film, resist masks 1001a to 1001e are formed. Then, first etching treatment for forming electrodes is performed, for which an ICP (Inductive Coupled Plasma) etching apparatus is used. For the first etching treatment, CF$_4$, Cl$_2$, and O$_2$ are added as an etching gas. This etching is performed under the conditions of an etching pressure of 1.3 Pa, a power supply of 800 W for generating plasma and a substrate bias power supply of 300 W. By this etching, the second conductive film has tapered patterns 1002a to 1002e (FIG. 10A).

Figure 10B:
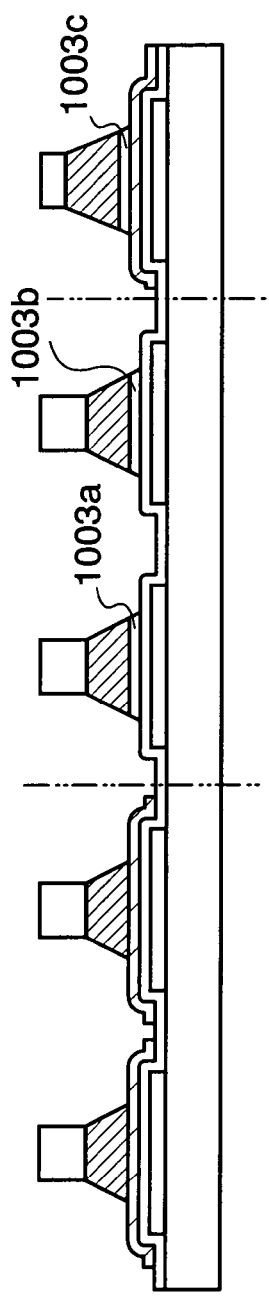

Subsequently, second etching treatment is performed by taper etching the silicon oxide film of the second insulating film 109 using CHF$_3$ gas. Accordingly, the second insulating film is formed into tapered top gate insulating films 1003a and 1003b, and a tapered second gate insulating film 1003c (FIG. 10B).

Figure 10C:
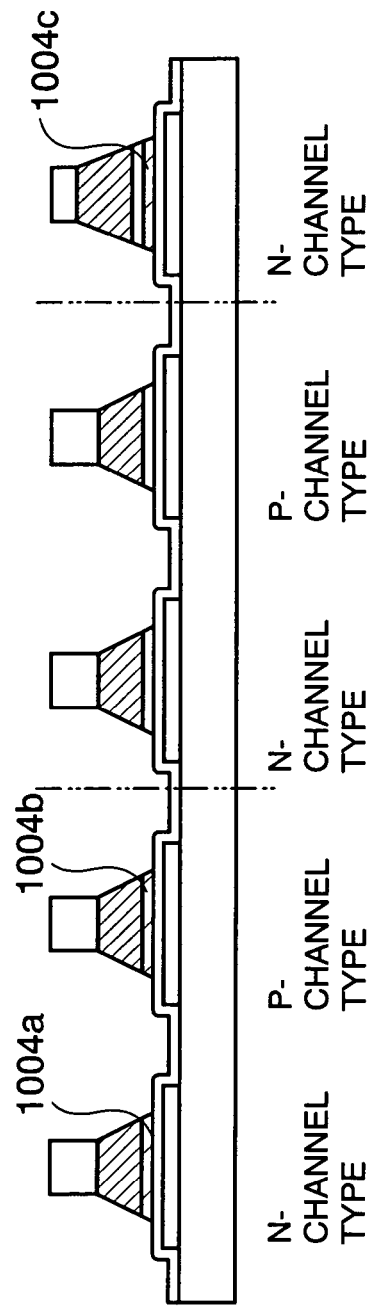

Subsequently, tantalum nitride or tantalum as the first conductive film is etched with an etching gas switched into CF$_4$ and Cl$_2$, as third etching treatment. This etching is performed under the conditions of an etching pressure of 1.3 Pa, a power supply of 500 W for generating plasma, and a substrate bias power supply of 10 W. In this manner, tapered bottom gate electrodes 1004a and 1004b, and a floating gate electrode 1004c can be formed (FIG. 10C).

Figure 11A:
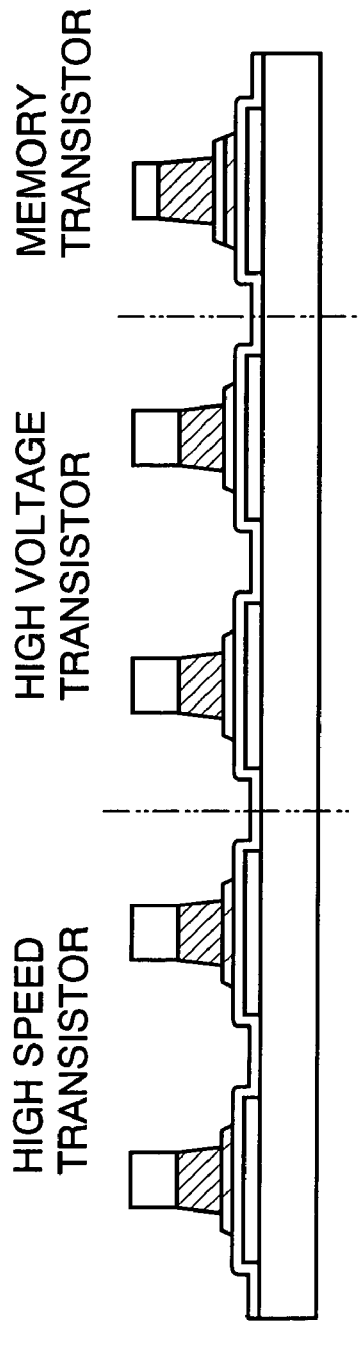
FIGS. 11A to 11C are diagrams showing manufacturing steps of the semiconductor memory device of the invention.

Subsequently, the tapered patterns 1002a to 1002e are anisotropically etched using an etching gas of $SF_6$, $Cl_2$, and $O_2$. This etching is performed under the conditions of an etching pressure of 1.9 Pa, a power supply of 500 W for generating plasma, and a substrate bias power supply of 3 W. By this anisotropic etching, edge portions of the tapered patterns 1002a to 1002e are formed inward the bottom gate electrodes 1004a and 1004b, the floating gate electrode 1004c, the tapered top gate insulating films 1003a and 1003b, and the tapered second gate insulating film 1003c (FIG. 11A).

Figure 11B:
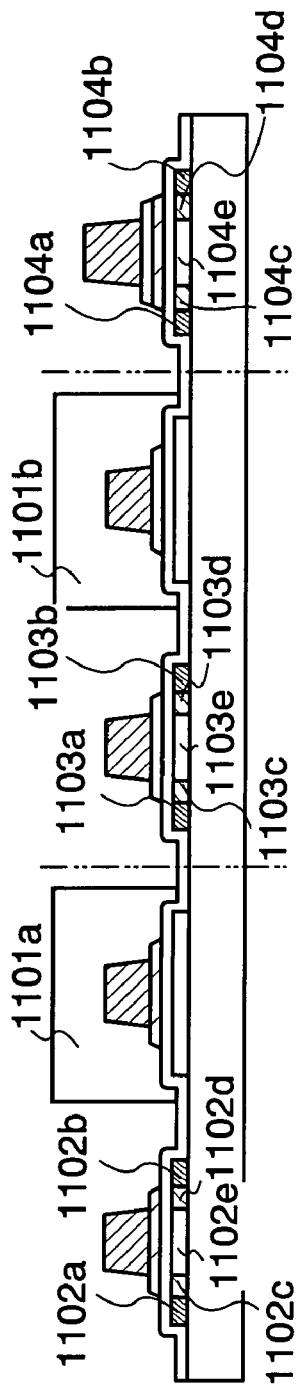

After removing the resist masks 1001a to 1001e, resist masks 1101a and 1101b are formed on the P-channel transistors, and ions are injected thereto at a phosphorus concentration of $1\times10^{19}$ to $5\times10^{21}/cm^3$. Accordingly, a source region 1102a and a drain region 1102b, Lov regions 1102c and 1102d, and a channel forming region 1102e of the N-channel high speed transistor are formed all at once. For the N-channel high voltage transistor, a source region 1103a and a drain region 1103b, Loff regions 1103c and 1103d, and a channel forming region 1103e are formed all at once. For the memory transistor, a source region 1104a and a drain region 1104b, Lov regions 1104c and 1104d, and a channel forming region 1104e are formed all at once (FIG. 11B).

Figure 11C:
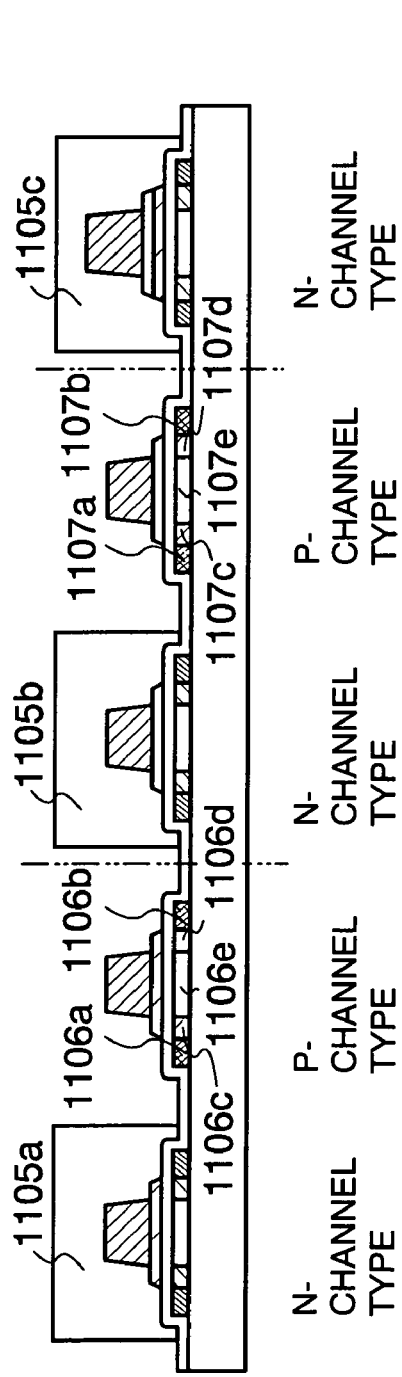

Subsequently, the resist masks 1101a and 1101b are peeled off by wet etching. Then, resist masks 1105a to 1105c are formed so as to cover the N-channel transistor and the memory transistor and ions are injected at an impurity (boron) concentration of $1\times10^{19}$ to $5\times10^{21}/cm^3$. Accordingly, a source region 1106a and a drain region 1106b, Lov regions 1106c and 1106d, and a channel forming region 1106e of the P-channel high speed transistor are formed. For the P-channel high voltage transistor, a source region 1107a and a drain region 1107b, Loff regions 1107c and 1107d, and a channel forming region 1107e are formed (FIG. 11C).

After peeling off the resist masks 1105a to 1105e by wet etching, a similar step to FIG. 5D is performed for completion. Moreover, by etching a tapered portion of the bottom gate electrode of the high speed transistor with the top gate electrode as a mask, an LDD structure having a Loff region can be formed. In this embodiment, a Loff region and a Lov region can be formed with the source region and the drain region by injecting impurity elements once. According to the structure of this embodiment, a single channel effect can be suppressed when it is generated as the circuit becomes finer. This embodiment can be applied to the manufacturing method of the semiconductor memory device using the semiconductor substrate shown in FIGS. 4A to 4F.

Embodiment 5

Figure 12:
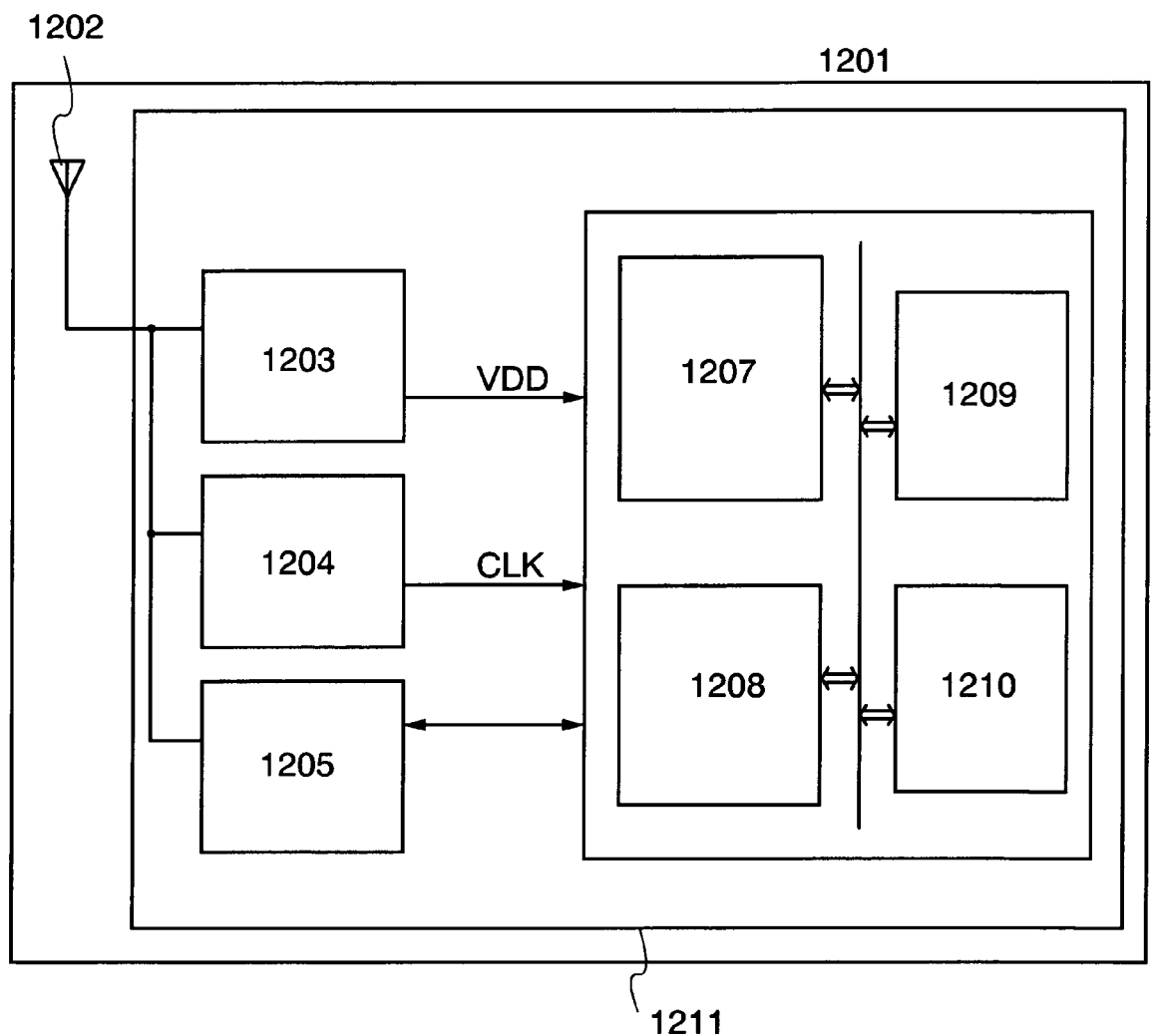
FIG. 12 is a typical block diagram of a semiconductor device using the semiconductor memory device of the invention.

FIG. 12 is a typical block diagram showing a non-contact IC card or ID tag incorporated with a CPU (Central Processing Unit) as an example of a semiconductor device using the semiconductor memory device of the invention. In FIG. 12, a semiconductor device 1201 incorporates an integrated circuit 1211 that includes a power source circuit 1203, a clock generating circuit 1204, a data demodulating/modulating circuit 1205, a CPU 1207, an interface (referred to as IF) 1208, a nonvolatile memory (referred to as NVM) 1209, and an SRAM 1210. Note that a volatile memory such as a DRAM may be used instead of the SRAM 1210.

In this embodiment, a memory transistor that forms the semiconductor memory device of the invention is used as the nonvolatile memory 1209. When a high speed transistor is required for a transistor that forms the clock generating circuit 1204, the data demodulating/modulating circuit 1205, the CPU 1207, the interface 1208, and the SRAM 1210, it can be manufactured at the same time as the semiconductor memory device of the invention by a manufacturing process of the high speed transistor that forms the semiconductor memory device of the invention. When a high voltage transistor is required for a transistor that forms the power source circuit 1203, it can be manufactured at the same time as the semiconductor memory device of the invention by a manufacturing process of the high voltage transistor that forms the semiconductor memory device of the invention. In this manner, the integrated circuit can be formed on the same substrate efficiently.

Further, since the semiconductor memory device of the invention that can be manufactured by a simplified manufacturing process at a low cost can be applied to the nonvolatile memory 1209, the semiconductor device 1201 that realizes cost reduction and downsizing can be provided.

The integrated circuit 1211 is formed over a glass substrate, a flexible substrate, or a semiconductor substrate. An antenna 1202 may be formed on the same substrate as the integrated circuit 1211 in the semiconductor device or may be formed in protective layers on the top and the bottom of the integrated circuit. In this manner, when forming an antenna on the same substrate as the integrated circuit 1121, a compound containing nano-particles can be formed by a printing method (a droplet discharging method or a screen printing method).

Moreover, the integrated circuit 1211 provided only with a connecting terminal with the antenna and the antenna 1202 formed of copper, aluminum and the like may be electrically connected by using an anisotropic conductive film and the like.

The integrated circuit 1211 has a size of 5 millimeters square or less, preferably 0.3 to 4 millimeters square, and the protective layers on the top and the bottom of the integrated circuit 1211 are larger than the semiconductor device.

This embodiment can be implemented in combination with Embodiment Modes 1 and 2, and Embodiments 1 to 4.

Embodiment 6

Figure 13:
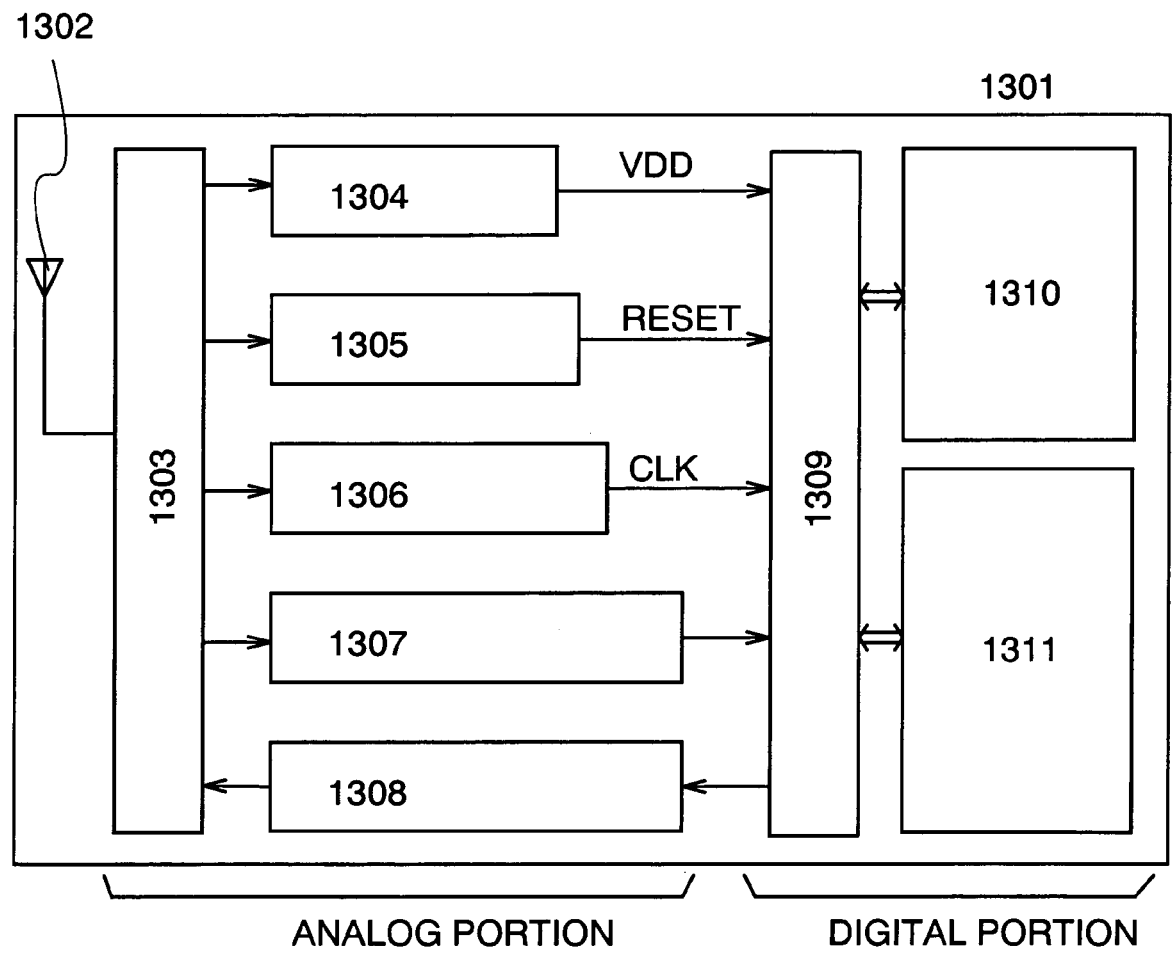
FIG. 13 is a typical block diagram of a non-contact RFID tag including the semiconductor memory device of the invention.

FIG. 13 is a typical block diagram of a non-contact RFID (Radio Frequency Identification) tag having the semiconductor memory device of the invention. FIG. 13 shows a configuration having a simple function to read out fixed data such as identification data. An RFID tag 1301 includes an antenna 1302, a high frequency circuit 1303, a power source circuit 1304, a reset circuit 1305, a clock generating circuit 1306, a data demodulating circuit 1307, a data modulating circuit 1308, a controlling circuit 1309, a nonvolatile memory (referred to as NVM) 1310, and a ROM 1311.

In this embodiment, a memory transistor that forms the semiconductor memory device of the invention is used for the nonvolatile memory 1310. When a high speed transistor is required for the high frequency circuit 1303, the reset circuit 1305, the clock generating circuit 1306, the data demodulating circuit 1307, the data modulating circuit 1308, the controlling circuit 1309, and the ROM 1311, it can be manufactured at the same time as the semiconductor memory device of the invention by a manufacturing process of the high speed transistor that forms the semiconductor memory device of the invention. When a high voltage transistor is required for the transistor that forms the power source circuit 1304, it can be manufactured at the same time as the semiconductor memory device of the invention by a manufacturing process of the high voltage transistor that forms the semiconductor memory device of the invention. In this manner, an RFID tag can be manufactured efficiently on the same substrate.

Further, since the semiconductor memory device of the invention that can be manufactured by a simplified manufacturing process at a low cost can be applied to the nonvolatile memory 1310, the RFID tag 1301 that realizes cost reduction and downsizing can be provided.

The circuits shown in FIG. 13 are all formed on a glass substrate, a flexible substrate, or a semiconductor substrate. The antenna 1302 may be formed on the glass substrate, the flexible substrate, or the semiconductor substrate. Otherwise, it may be provided outside the substrate and be connected to a semiconductor integrated circuit inside the substrate.

The high frequency circuit 1303 receives an analog signal from the antenna 1302 and outputs from the antenna 1302 an analog signal received from the data modulating circuit 1308. The power source circuit 1304 generates a constant power source from the received signals, the reset circuit 1305 generates a reset signal, the clock generating circuit 1306 generates a clock signal, the data demodulating circuit 1307 extracts data from the received signals, and the data modulating circuit 1308 generates an analog signal to be outputted to the antenna or changes antenna characteristics based on a digital signal received from the controlling circuit. An analog portion is formed of the aforementioned circuits.

On the other hand, the controlling circuit 1309 reads data by receiving data extracted from the received signal. In specific, the controlling circuit 1309 generates an address signal of the nonvolatile memory 1310 and the ROM 1311, reads data, and transmits the read data to the data modulating circuit. A digital portion is formed of the aforementioned circuits.

This embodiment can be implemented in combination with Embodiment Modes 1 and 2, and Embodiments 1 to 4.

Embodiment 7

Application modes of the ID tag described in Embodiments 5 and 6 are described now. Note that a card mounting the ID tag described in Embodiments 5 and 6 (hereinafter referred to as an IDF card) is described in this embodiment.

Figure 14A:
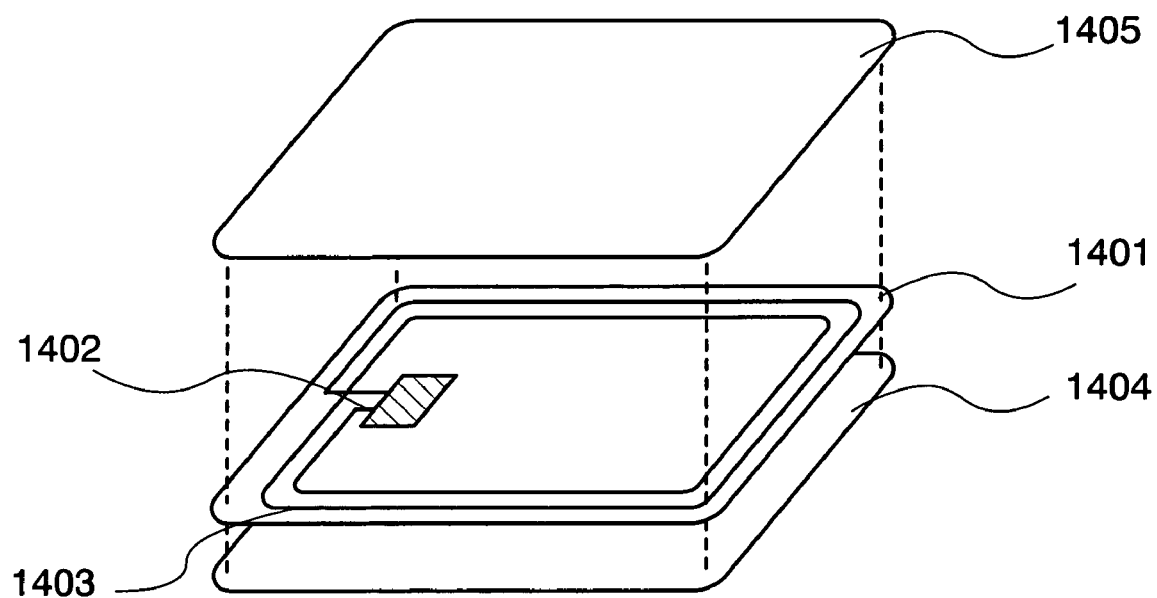
FIGS. 14A and 14B are views of a card mounting an IDF chip.

FIG. 14A shows an insulating substrate 1401 on which an IDF chip 1402 storing identification data and an antenna 1403 are provided.

Figure 14B:
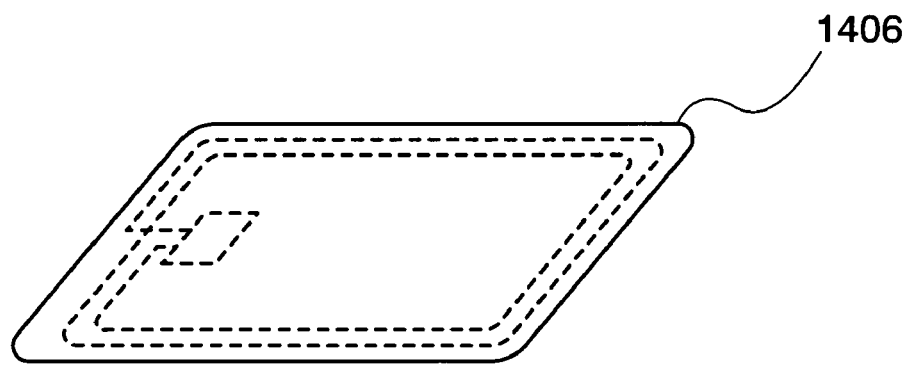

As shown in FIG. 14B, a first film 1404 and a second film 1405 are attached to form an IDF card 1406. It is preferable that the IDF chip at this time be disposed at a center portion relative to the card to be mounted and the periphery of the IDF chip be covered with the substratum, that is a first film and a second film in this embodiment. Consequently, the mechanical strength of the IDF chip can be enhanced. In specific, when a position to sandwich the IDF chip (the through-thickness center of the IDF chip) is X and the thickness of the card is D, the IDF chip is preferably disposed so as to satisfy $(1/2) \times D - 30\ \mu m < X < (1/2) \times D + 30\ \mu m$.

In this embodiment, the case of using the IDF chip in which the antenna is formed on the substrate is described, however, the IDF mounting an antenna may be used as well. It is preferable that the IDF chip satisfy the aforementioned position of the formula.

Embodiment 8

In this embodiment, the case where the semiconductor memory device of the invention is formed into a chip and incorporated in a device for a specific application is described with reference to FIGS. 15A and 15B. In this embodiment, the chip is packaged and mounted by a BGA (Ball Grid Array) technology as an example.

Figure 15A:
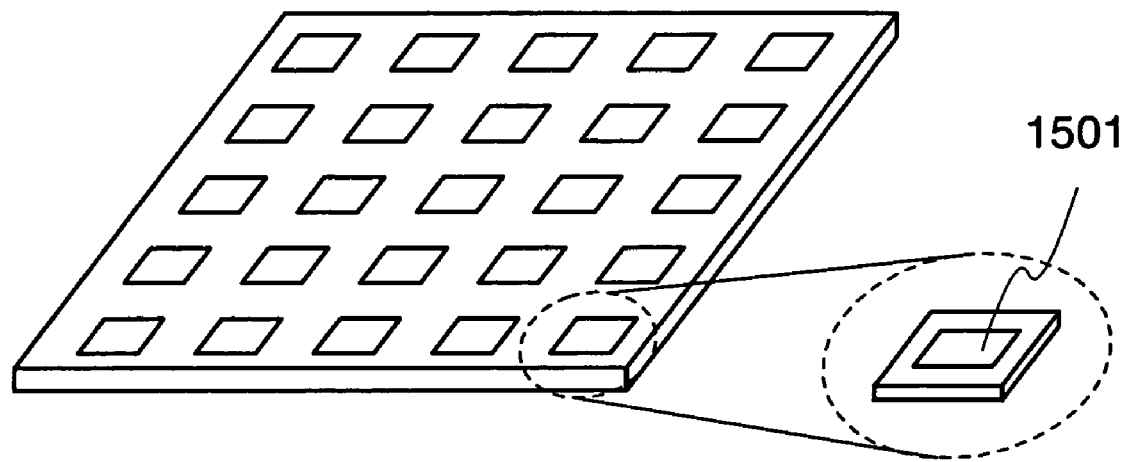
FIGS. 15A and 15B are views of the packaged semiconductor memory device of the invention.
Figure 15B:
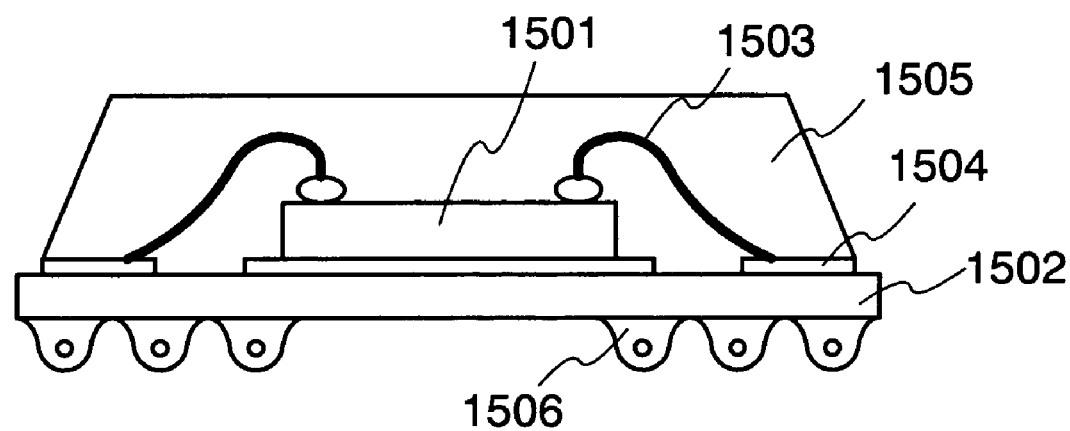

As shown in FIG. 15A, a semiconductor memory device 1501 that is separated from a substrate on which a plurality of the semiconductor memory devices of the invention are formed is stuck to a substrate 1502 such as a resin substrate. The semiconductor memory device 1501 is bonded through a wiring 1503 formed of a gold wiring to a lead frame 1504 and sealed with resin 1505. On the back of the resin substrate to which the semiconductor memory device 1501 is stuck, a solder ball terminal 1506 is formed. The packaged chip like this is mounted in a specific device through the solder ball terminal 1506.

Since the semiconductor memory device of the invention can be manufactured on the same substrate, a plurality of the semiconductor memory devices can be formed and separated as described in this embodiment to manufacture a large quantity of memory chips at a time.

Embodiment 9

In this embodiment, the nonvolatile memory as an example of the semiconductor memory device of the invention is applied to a system LSI that is integrated on one chip.

The system LSI is an LSI that is incorporated in a device for a specific application and constitutes a system for controlling the device and processing data. The application ranges widely, such as a portable phone, a PDA, a DSC, a television, a printer, a FAX, a game machine, a car navigation system, a DVD player and the like.

Figure 16:
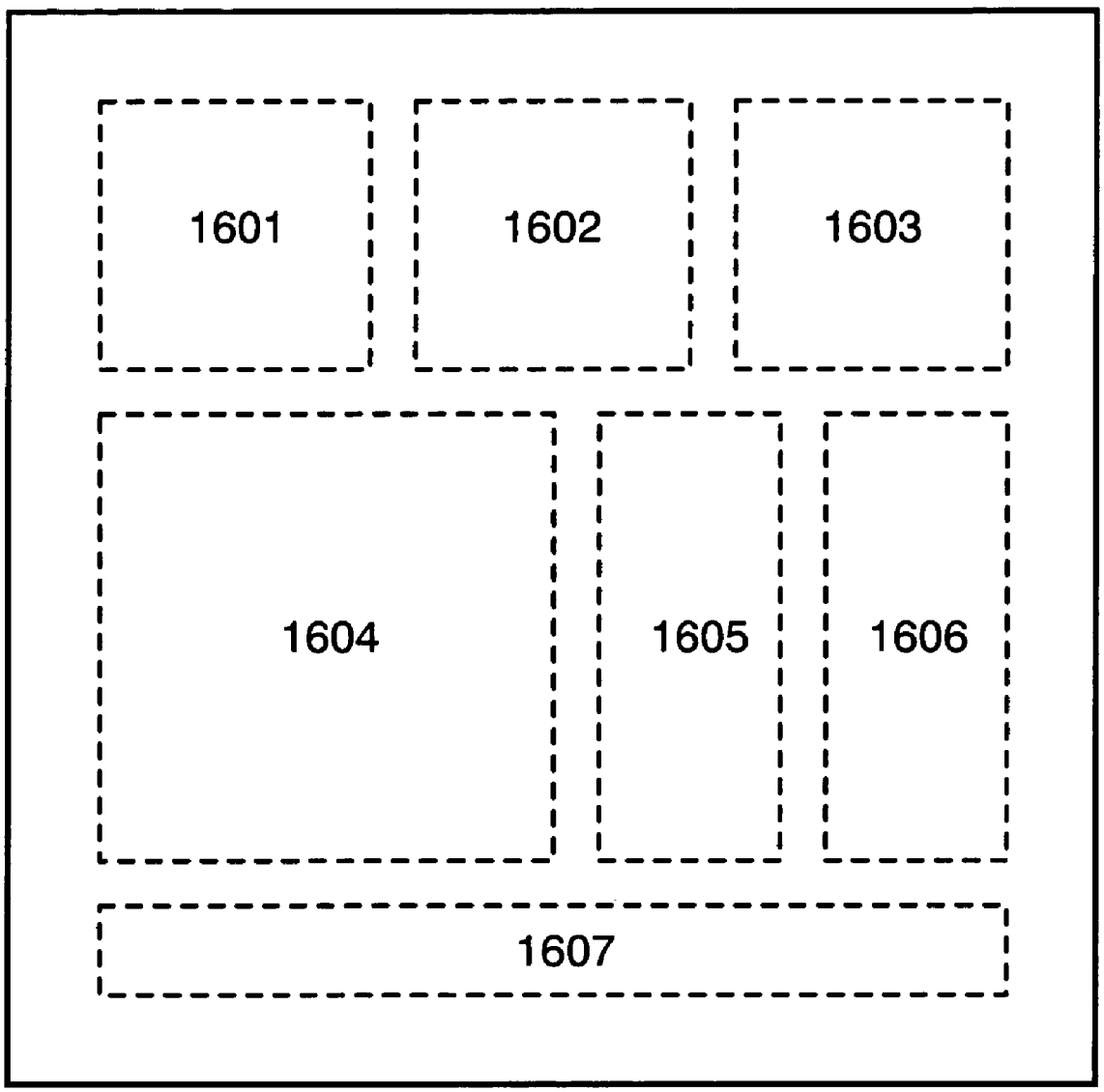
FIG. 16 is a diagram showing a system LSI integrated by using the semiconductor memory device of the invention.

FIG. 16 shows an example of the system LSI. The system LSI typically includes a CPU core 1601, a flash memory 1604, a clock controller 1603, a main memory 1602, a memory controller 1605, an interrupt controller 1606, an I/O port 1607 and the like. It is needless to say that the system LSI shown in FIG. 16 is only a simplified example and a wide variety of circuit designs are laid out according to the application of an actual system LSI.

A memory transistor that forms the semiconductor memory device of the invention can be used for the flash memory 1604. For the main memory 1602, an SRAM and a DRAM can be used, for example. By using a flash memory of a system LSI for the semiconductor memory device of the invention, cost reduction and downsizing of the system LSI can be realized.

When a high speed transistor is required for a transistor that forms the CPU core 1601, the clock controller 1603, the main memory 1602, the memory controller 1605, the interrupt controller 1606, and the I/O port 1607, it can be manufactured similarly to the high speed transistor that forms the semiconductor memory device of the invention. Accordingly, the other circuits can be efficiently manufactured on the same substrate as the semiconductor device.

This embodiment can be implemented in combination with Embodiment Modes 1 and 2, and Embodiments 1 to 4. Embodiment 8 is an example of forming the semiconductor memory device into a chip. In this embodiment also, the system LSI may be packaged to be mounted.

Embodiment 10

In this embodiment, an example of sticking or manufacturing the semiconductor memory device of the invention on the same substrate as the panel is described with reference to FIGS. 17A and 17B, and 18.

Figure 17A:
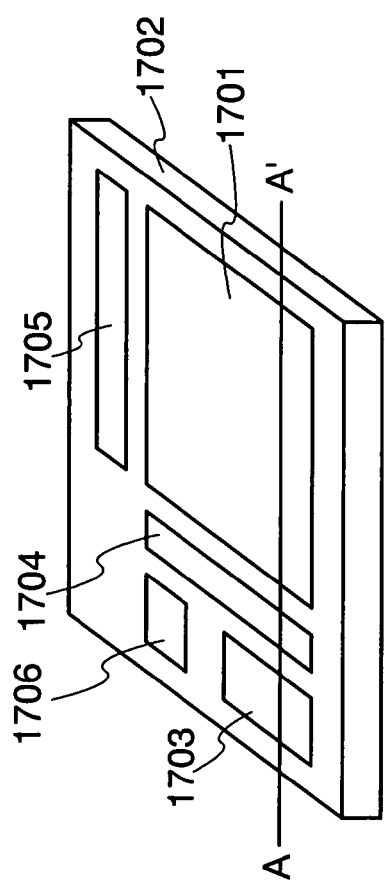
FIGS. 17A and 17B are diagrams showing the semiconductor memory device of the invention provided on the same substrate as a pixel portion.

FIG. 17A shows an example where the semiconductor memory device of the invention is provided on the same substrate as a pixel portion 1701. A substrate 1702 may be any substrates including a glass substrate. Reference numeral 1703 denotes a memory portion, 1704 denotes a gate driver circuit, 1705 denotes a source driver circuit, and 1706 denotes an external input terminal. A sectional diagram along A-A' in FIG. 17A is shown in FIG. 17B. The pixel portion 1701 and the gate driver circuit 1704 are formed on the substrate 1702. The pixel portion 1701 is formed of a plurality of pixels each of which includes a current controlling thin film transistor 1710 and a pixel electrode 1711 electrically connected to a drain thereof. The gate driver circuit 1704 is formed by using a CMOS circuit 1712 in which an N-channel thin film transistor and a P-channel FET are combined complementarily.

The pixel electrode 1711 functions as a cathode of an EL element. Moreover, a light emitting layer and a hole injecting layer are formed on the pixel electrode 1711. Further, an anode, a passivation film and the like of the EL element are formed thereon. The memory portion 1703 is formed of a high speed transistor 1721, a high voltage transistor 1722, and a memory transistor 1723.

The memory portion 1703 and the driver circuit or the pixel portion are electrically connected through the connecting wiring 1714, the anisotropic conductive film 1716, and the electrode pad 1717. More specifically, a wiring portion of the high speed transistor of the semiconductor memory device is electrically connected to the driver circuit or the pixel portion.

Reference numeral 1718 denotes a cover material, 1719 denotes a first sealant, and 1720 denotes a second sealant. Fillers (not shown) are provided between the cover material 1718 and the substrate 1702 inside the first sealant 1719.

Figure 17B:
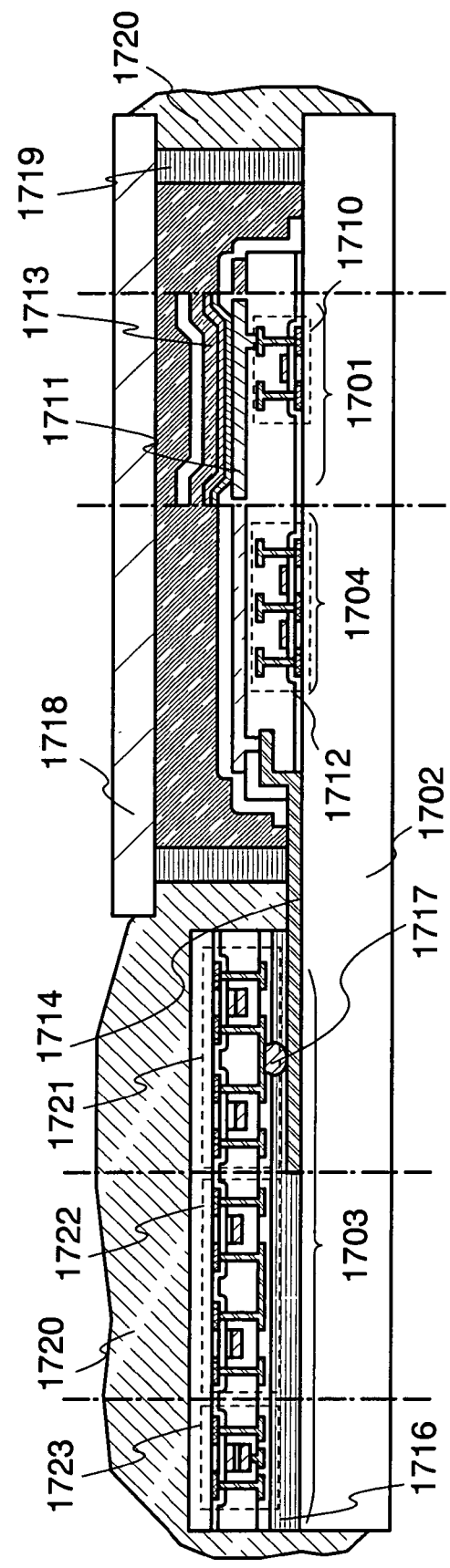

FIG. 17B shows an example of sticking the semiconductor memory device upside-down to the substrate 1702, however, the substrate 1702 and a substrate on which the semiconductor memory device is formed may be attached as well. Further, an EL display device is described in this embodiment, however, it is needless to say that the semiconductor memory device may be provided on the same substrate as a liquid crystal panel to form a liquid crystal display device as well.

As described above, the semiconductor memory device of the invention can be provided as a memory in a pixel portion, and a display device provided with a small memory can be provided at a low cost.

Figure 18:
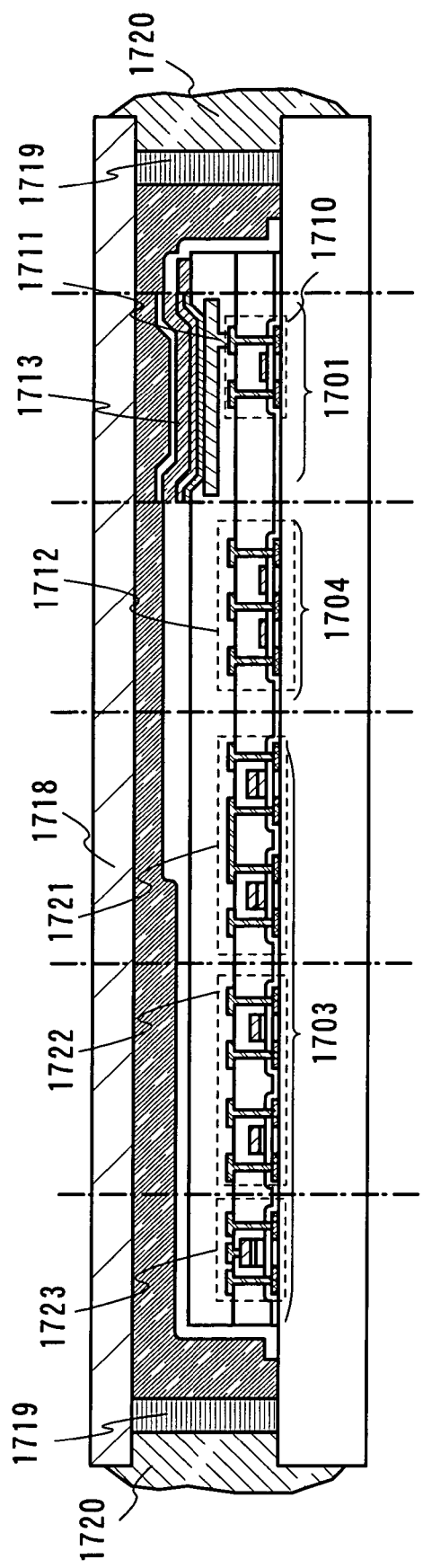
FIG. 18 is a diagram showing the semiconductor memory device of the invention provided on the same substrate as a pixel portion.

FIG. 18 shows an example of providing a memory portion on the same substrate as that provided with a pixel portion and a driver circuit. In FIG. 18, common portions with FIGS. 17A and 17B are denoted by the same reference numerals and detailed descriptions thereof are omitted. In FIG. 18, although not shown, a wiring of the high speed transistor in the memory portion and a peripheral driver circuit are electrically connected through wirings that are directly connected to a source region and a drain region of each transistor. Therefore, the driver circuit portion and the memory portion can be connected more easily than the case of FIGS. 17A and 17B. According to the configuration of FIG. 18, all the elements can be manufactured on the same substrate at the same time, therefore, a smaller display device that is lower in cost than that of FIGS. 17A and 17B can be obtained, and a manufacturing process can be simplified as well.

Embodiment 11

By using the invention, various semiconductor devices can be formed. For example, a portable information terminal (an electronic data book, a mobile computer, a portable phone and the like), a video camera, a digital camera, a personal computer, a television receiver, a projection display device and the like can be suggested. Example of those are shown in FIGS. 19A to 19G. Note that a method for mounting or disposing the semiconductor memory device of the invention to apparatuses shown in FIGS. 19A to 19G are referred in Embodiments 8 to 10.

Figure 19A:
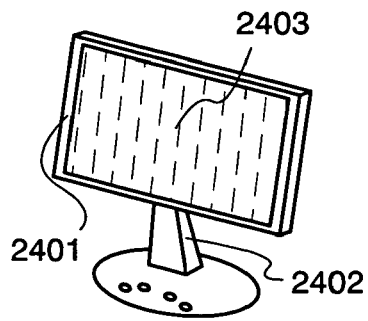
FIGS. 19A to 19G are views showing examples of a semiconductor apparatus using the semiconductor memory device of the invention.

FIG. 19A illustrates an example of completing a television receiver by applying the invention. The television receiver includes a housing 2401, a support base 2402, a display portion 2403 and the like. By providing the semiconductor memory device of the invention, a low cost television receiver can be provided.

Figure 19B:
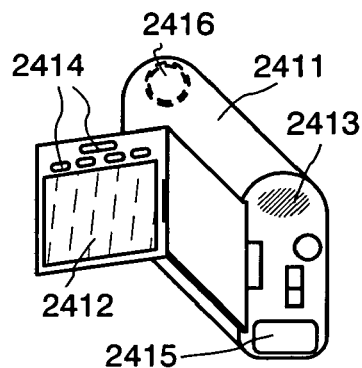

FIG. 19B illustrates an example of completing a video camera by applying the invention. The video camera includes a main body 2411, a display portion 2412, an audio input portion 2413, operating switches 2414, a battery 2415, a receiving portion 2416 and the like. By providing the semiconductor memory device of the invention, a low cost video camera can be provided.

Figure 19C:
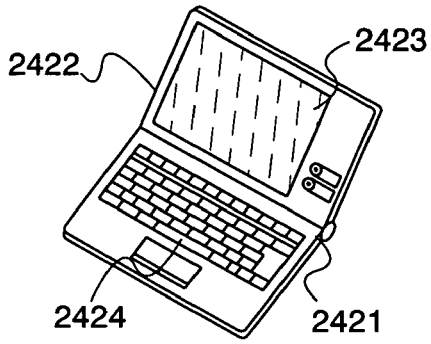

FIG. 19C illustrates an example of completing a notebook personal computer by applying the invention. The notebook personal computer includes a main body 2421, a housing 2422, a display portion 2423, a keyboard 2424, and the like. By providing the semiconductor device of the invention, a low cost notebook personal computer can be provided.

Figure 19D:
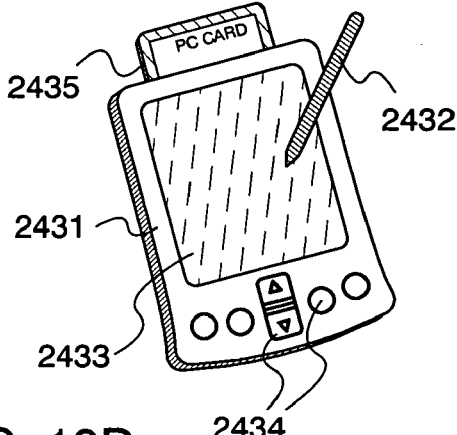

FIG. 19D illustrates an example of completing a PDA (Personal Digital Assistant) by applying the invention. The PDA includes a main body 2431, a stylus 2432, a display portion 2433, operating buttons 2434, an external interface 2435 and the like. By providing the semiconductor memory device of the invention, a low cost PDA can be provided.

Figure 19E:
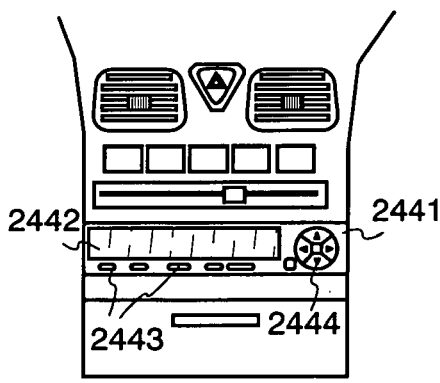

FIG. 19E illustrates an example of completing an audio reproducing apparatus, specifically a car audio system by applying the invention. The audio reproducing apparatus includes a main body 2441, a display portion 2442, operating switches 2443, 2444 and the like. By providing the semiconductor memory device of the invention, a low cost audio reproducing apparatus can be provided.

Figure 19F:
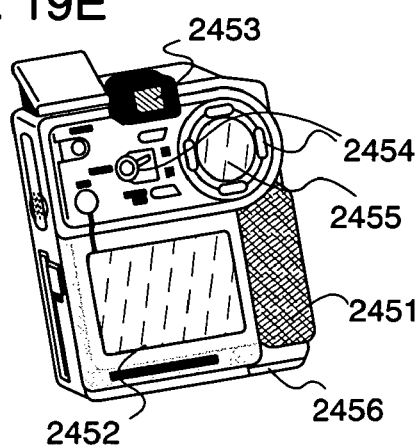

FIG. 19F illustrate an example of completing a digital camera by applying the invention. The digital camera includes a main body 2451, a display portion (A) 2452, an ocular portion 2453, operating switches 2454, a display portion (B) 2455, a battery 2456 and the like. By providing the semiconductor memory device of the invention, a low cost digital camera can be provided.

Figure 19G:
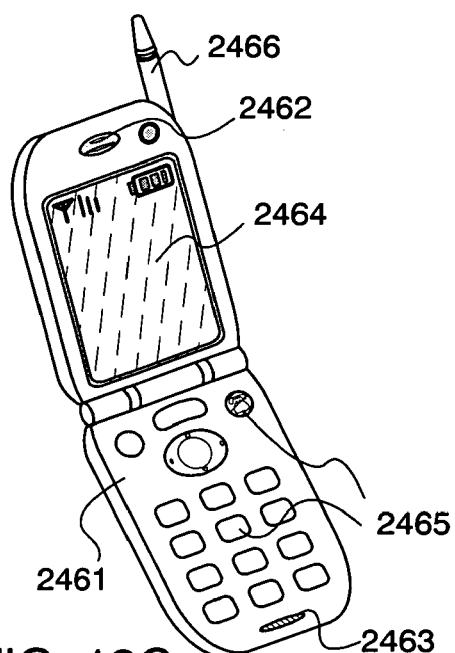

FIG. 19G illustrates an example of completing a portable phone by applying the invention. The portable phone includes a main body 2461, an audio output portion 2462, an audio input portion 2463, a display portion 2464, operating switches 2465, an antenna 2466 and the like. By providing the semiconductor memory device of the invention, a low cost portable phone can be provided.

Note that the apparatuses described here are only examples and the invention is not limited to these applications.

This embodiment can be implemented in combination with Embodiment Modes 1 and 2, Embodiments 1 to 4, and 8 to 10.

This application is based on Japanese Patent Application serial no. 2004-063901 filed in Japan Patent Office on Mar. 8, 2004, the contents of which are hereby incorporated by reference.

What is claimed is:

1. A semiconductor device comprising:
a memory portion comprising a first transistor and a second transistor,
the first transistor comprising:
a first active layer;
a first gate insulating film over the first active layer;
a floating gate electrode over the first gate insulating film;

a second gate insulating film over the floating gate
electrode; and
a control gate electrode over the second gate insulating film;
the second transistor comprising:
a second active layer;
a third gate insulating film over the second active layer;
a fourth gate insulating film on and in contact with the third gate insulating film; and
a gate electrode over the fourth gate insulating film;
a pixel portion comprising a third transistor over a substrate having an insulating surface;
a driver circuit portion comprising a fourth transistor over the substrate; and
a connecting portion including an electrode pad capable of electrically connecting the memory portion to one of the pixel portion and the driver circuit portion,
wherein the resistivity of the material of the control gate electrode is lower than the resistivity of the material of the floating gate electrode,
wherein the memory portion is stuck to the substrate,
wherein the third gate insulating film and the first gate insulating film are made from a same insulating material, and
wherein the fourth gate insulating film and the second gate insulating film are made from a same insulating material.

2. A semiconductor device comprising:
a memory portion comprising a first transistor and a second transistor,
the first transistor comprising:
a first active layer;
a first gate insulating film over the first active layer;
a floating gate electrode over the first gate insulating film;
a second gate insulating film over the floating gate electrode; and
a control gate electrode over the second gate insulating film;
the second transistor comprising:
a second active layer;
a gate insulating film over the second active layer;
a first gate electrode over the gate insulating film; and
a second gate electrode on and in contact with the first gate electrode,
a pixel portion comprising a third transistor over a substrate having an insulating surface;
a driver circuit portion comprising a fourth transistor over the substrate; and
a connecting portion including an electrode pad capable of electrically connecting the memory portion to one of the pixel portion and the driver circuit portion,
wherein the resistivity of the material of the control gate electrode is lower than the resistivity of the material of the floating gate electrode,
wherein the memory portion is stuck to the substrate,
wherein the first gate electrode and the floating gate electrode are made from a same conductive material, and
wherein the second gate electrode and the control gate electrode are made from a same conductive material.

3. A semiconductor device comprising:
a memory portion comprising a first transistor, a second transistor and a third transistor,
the first transistor comprising:
a first active layer;
a first gate insulating film over the first active layer;
a floating gate electrode over the first gate insulating film;
a second gate insulating film over the floating gate electrode; and
a control gate electrode over the second gate insulating film;
the second transistor comprising:
a second active layer;
a gate insulating film over the second active layer;
a first gate electrode over the gate insulating film; and
a second gate electrode on and in contact with the first gate electrode; and
the third transistor comprising:
a third active layer;
a third gate insulating film over the third active layer;
a fourth gate insulating film on and in contact with the third gate insulating film; and
a gate electrode over the fourth gate insulating film;
a pixel portion comprising a third transistor over a substrate having an insulating surface;
a driver circuit portion comprising a fourth transistor over the substrate; and
a connecting portion including an electrode pad capable of electrically connecting the memory portion to one of the pixel portion and the driver circuit portion,
wherein the resistivity of the material of the control gate electrode is lower than the resistivity of the material of the floating gate electrode,
wherein the memory portion is stuck to the substrate,
wherein the third gate insulating film, the first gate insulating film and the gate insulating film of the second transistor are made from a same insulating material,
wherein the fourth gate insulating film and the second gate insulating film are made from a same insulating material,
wherein the first gate electrode and the floating gate electrode are made from a same conductive material, and
wherein the second gate electrode, the control gate electrode and the gate electrode of the third transistor are made from a same conductive material.

4. The semiconductor device according to claim 1, wherein the first active layer and the second active layer are any one of a crystalline semiconductor film and a microcrystalline semiconductor film.

5. The semiconductor device according to claim 2, wherein the first active layer and the second active layer are any one of a crystalline semiconductor film and a microcrystalline semiconductor film.

6. The semiconductor device according to claim 2, wherein the second gate electrode is used as a leading wiring.

7. The semiconductor device according to claim 3, wherein the second gate electrode is used as a leading wiring.

8. The semiconductor device according to claim 1, wherein the substrate is any one of a quartz substrate, a glass substrate and a plastic substrate.

9. The semiconductor device according to claim 2, wherein the substrate is any one of a quartz substrate, a glass substrate and a plastic substrate.

10. The semiconductor device according to claim 3, wherein the substrate is any one of a quartz substrate, a glass substrate and a plastic substrate.

11. The semiconductor device according to claim 1, wherein the semiconductor device is one selected from the group consisting of a portable information terminal, a video camera, a digital camera, a personal computer, a television receiver, and a projection display device.

12. The semiconductor device according to claim 2, wherein the semiconductor device is one selected from the group consisting of a portable information terminal, a video camera, a digital camera, a personal computer, a television receiver, and a projection display device.

13. The semiconductor device according to claim 3, wherein the semiconductor device is one selected from the group consisting of a portable information terminal, a video camera, a digital camera, a personal computer, a television receiver, and a projection display device.

14. The semiconductor device according to claim 1, wherein the semiconductor device is an ID tag.

15. The semiconductor device according to claim 2, wherein the semiconductor device is an ID tag.

16. The semiconductor device according to claim 3, wherein the semiconductor device is an ID tag.

17. The semiconductor device according to claim 1, wherein the semiconductor device is a liquid crystal display device or an EL display device.

18. The semiconductor device according to claim 2, wherein the semiconductor device is a liquid crystal display device or an EL display device.

19. The semiconductor device according to claim 3, wherein the semiconductor device is a liquid crystal display device or an EL display device.

20. The semiconductor device according to claim 1, the control gate electrode is located between the floating gate electrode and the substrate.

21. The semiconductor device according to claim 2, the control gate electrode is located between the floating gate electrode and the substrate.

22. The semiconductor device according to claim 3, the control gate electrode is located between the floating gate electrode and the substrate.

23. A semiconductor device comprising:
a first transistor comprising:
a first active layer;
a first insulating film over the first active layer;
a floating gate electrode over the first gate insulating film;
a second insulating film over the floating gate electrode; and
a control gate electrode over the second gate insulating film; and
a second transistor comprising:
a second active layer;
a third insulating film over the second active layer;
a fourth insulating film on and in contact with the third insulating film; and
a gate electrode over the fourth insulating film;
wherein the third insulating film and the first insulating film are made from a same insulating material,
wherein the fourth insulating film and the second insulating film are made from a same insulating material, and
wherein the resistivity of the material of the control gate electrode is lower than the resistivity of the material of the floating gate electrode.

24. A semiconductor device comprising:
a first transistor comprising:
a first active layer;
a first insulating film over the first active layer;
a floating gate electrode over the first gate insulating film;
a second insulating film over the floating gate electrode; and
a control gate electrode over the second gate insulating film; and
a second transistor comprising:
a second active layer;
a third insulating film over the second active layer;
a first gate electrode over the insulating film; and
a second gate electrode on and in contact with the first gate electrode,
wherein the first gate electrode and the floating gate electrode are made from a same conductive material,
wherein the second gate electrode and the control gate electrode are made from a same conductive material, and
wherein the resistivity of the material of the control gate electrode is lower than the resistivity of the material of the floating gate electrode.

25. A semiconductor device comprising:
a first transistor comprising:
a first active layer;
a first insulating film over the first active layer;
a floating gate electrode over the first gate insulating film;
a second insulating film over the floating gate electrode; and
a control gate electrode over the second insulating film;
a second transistor comprising:
a second active layer;
a third insulating film over the second active layer;
a first gate electrode over the third insulating film; and
a second gate electrode on and in contact with the first gate electrode; and
a third transistor comprising:
a third active layer;
a fourth insulating film over the third active layer;
a fifth insulating film on and in contact with the fourth insulating film; and
a gate electrode over the fifth insulating film;
wherein the fourth insulating film, the first insulating film and the third gate insulating film are made from a same insulating material,
wherein the fifth insulating film and the second insulating film are made from a same insulating material,
wherein the first gate electrode and the floating gate electrode are made from a same conductive material,
wherein the second gate electrode, the control gate electrode and the gate electrode of the third transistor are made from a same conductive material, and
wherein the resistivity of the material of the control gate electrode is lower than the resistivity of the material of the floating gate electrode.

26. The semiconductor device according to claim 23, wherein the floating gate comprises tantalum nitride.

27. The semiconductor device according to claim 24, wherein the floating gate comprises tantalum nitride.

28. The semiconductor device according to claim 25, wherein the floating gate comprises tantalum nitride.

29. The semiconductor device according to claim 23, wherein the control gate comprises tungsten.

30. The semiconductor device according to claim 24, wherein the control gate comprises tungsten.

31. The semiconductor device according to claim 25, wherein the control gate comprises tungsten.

32. The semiconductor device according to claim 23, wherein the dielectric constant of the second insulating film is larger than the dielectric constant of the first insulating film.

33. The semiconductor device according to claim 24, wherein the dielectric constant of the second insulating film is larger than the dielectric constant of the first insulating film.

34. The semiconductor device according to claim 25, wherein the dielectric constant of the second insulating film is larger than the dielectric constant of the first insulating film.

35. The semiconductor device according to claim 1, wherein the floating gate comprises tantalum nitride.

36. The semiconductor device according to claim 2, wherein the floating gate comprises tantalum nitride.

37. The semiconductor device according to claim 3, wherein the floating gate comprises tantalum nitride.

38. The semiconductor device according to claim 1, wherein the control gate comprises tungsten.

39. The semiconductor device according to claim 2, wherein the control gate comprises tungsten.

40. The semiconductor device according to claim 3, wherein the control gate comprises tungsten.

41. The semiconductor device according to claim 1, wherein the dielectric constant of the second insulating film is larger than the dielectric constant of the first insulating film.

42. The semiconductor device according to claim 2, wherein the dielectric constant of the second insulating film is larger than the dielectric constant of the first insulating film.

43. The semiconductor device according to claim 3, wherein the dielectric constant of the second insulating film is larger than the dielectric constant of the first insulating film.

* * * * *